(12) United States Patent
Hirota

(10) Patent No.: US 8,688,261 B2
(45) Date of Patent: Apr. 1, 2014

(54) TRANSPORT APPARATUS, POSITION TEACHING METHOD, AND SENSOR JIG

(75) Inventor: Kenji Hirota, Hiroshima (JP)

(73) Assignee: Rorze Corporation, Fukuyama-shi (JP)

( * ) Notice: Subject to any disclaimer, the term of this patent is extended or adjusted under 35 U.S.C. 154(b) by 359 days.

(21) Appl. No.: 12/994,823

(22) PCT Filed: May 19, 2009

(86) PCT No.: PCT/JP2009/059181
§ 371 (c)(1),
(2), (4) Date: Nov. 26, 2010

(87) PCT Pub. No.: WO2009/145082
PCT Pub. Date: Dec. 3, 2009

(65) Prior Publication Data
US 2011/0130864 A1    Jun. 2, 2011

(30) Foreign Application Priority Data

May 27, 2008 (JP) ................................. 2008-138785

(51) Int. Cl.
G06F 7/00 (2006.01)
H01L 21/68 (2006.01)
B65G 1/00 (2006.01)
B25J 9/22 (2006.01)

(52) U.S. Cl.
USPC ........... 700/213; 700/214; 700/228; 700/229; 700/218; 700/245; 700/250; 414/321; 318/568.13; 318/625; 901/47; 901/3

(58) Field of Classification Search
None
See application file for complete search history.

(56) References Cited

U.S. PATENT DOCUMENTS

| | | |
|---|---|---|
| 6,438,449 B2 | 8/2002 | Kawamatsu et al. |
| 7,167,805 B2 | 1/2007 | Saeki et al. |
| 7,706,919 B2 | 4/2010 | Adachi et al. |
| 2006/0015279 A1 | 1/2006 | Saeki et al. |
| 2006/0192514 A1 | 8/2006 | Adachi et al. |
| 2009/0198377 A1 | 8/2009 | Adachi et al. |

FOREIGN PATENT DOCUMENTS

| | | |
|---|---|---|
| CN | 1711155 A | 12/2005 |
| JP | 11-163083 | 6/1999 |
| JP | 3 306 398 | 5/2002 |
| JP | 2005 011966 | 1/2005 |

(Continued)

OTHER PUBLICATIONS

International Search Report issued Aug. 25, 2009 filed in PCT/JP09/059181 filed May 19, 2009.

(Continued)

Primary Examiner — Yolanda Jones
(74) Attorney, Agent, or Firm — Oblon, Spivak, McClelland, Maier & Neustadt, L.L.P.

(57) ABSTRACT

Disclosed are a transport apparatus that holds and transports an object on a predetermined transport track using a transport portion provided at the leading end of an arm and is capable of acquiring the teaching information of a transport position using a normal transport operation, a position teaching method, and a sensor jig. A transmissive sensor (32) is provided in a sensor jig (30) such that the projection segments of an optical axis (41) and an optical axis (42) on a projection plane intersect with each other and neither the project segment of the optical axis (41) nor the projection segment of the optical axis (42) is aligned with the X-direction and the Y-direction. During a position teaching operation, the sensor jig (30) is provided so as to be held by a wafer transport portion (24), thereby detecting target members (51, 52).

22 Claims, 24 Drawing Sheets

(56) References Cited

FOREIGN PATENT DOCUMENTS

| JP | 2005 118951 | 5/2005 |
| JP | 2005 123261 | 5/2005 |
| JP | 2005123261 A * | 5/2005 |
| JP | 2005 310858 | 11/2005 |
| JP | 2008 114348 | 5/2008 |
| WO | 03 022534 | 3/2003 |
| WO | 2007 010725 | 1/2007 |

OTHER PUBLICATIONS

Office Action issued Mar. 29, 2013 in Japanese patent application No. 2010-514445 w/English translation.
Office Action issued May 15, 2013 in Chinese patent application No. 200980119092.2 w/English translation.

* cited by examiner

FIG. 1
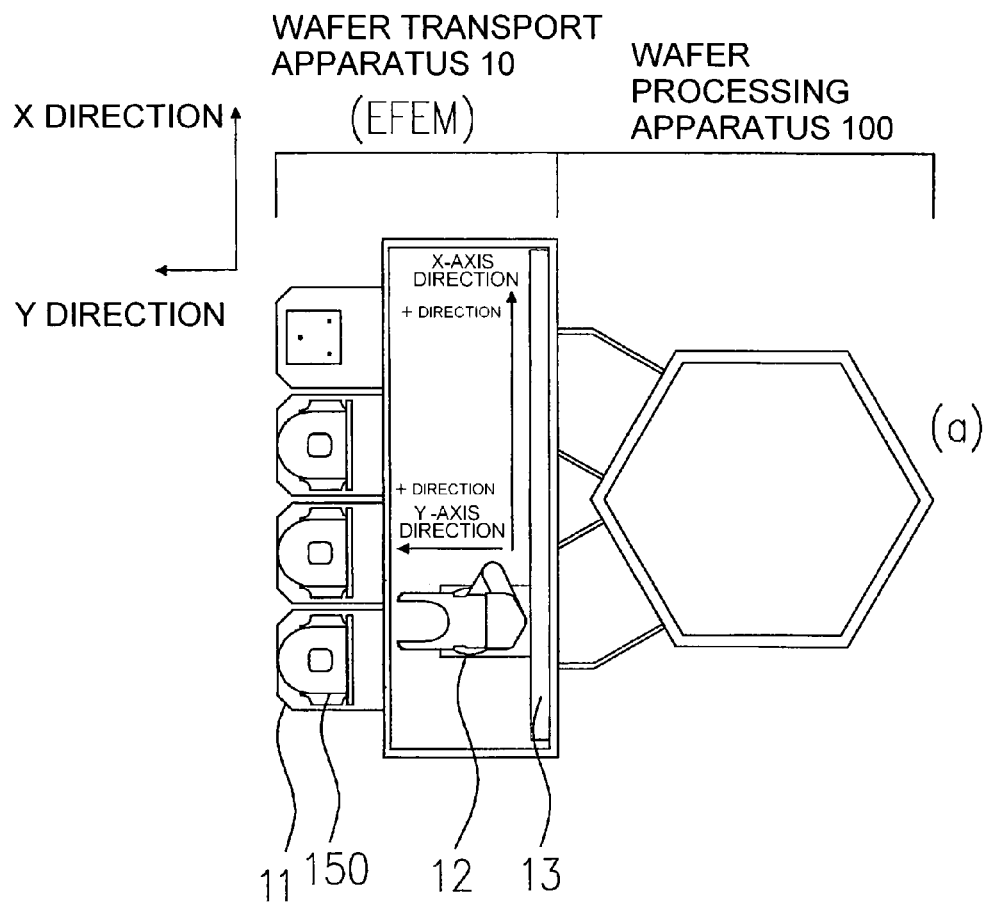
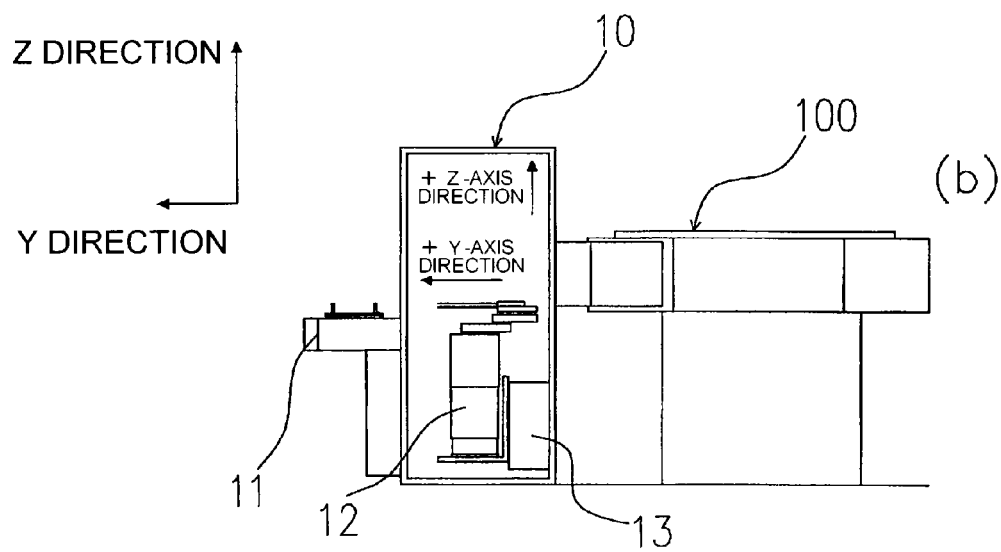

TRANSPORT APPARATUS, POSITION TEACHING METHOD, AND SENSOR JIG

TECHNICAL FIELD

The present invention relates to a transport apparatus that holds and transports an object on a predetermined transport track using a transport portion provided at the leading end of an arm, a position teaching method of teaching a predetermined target position on the transport track to the transport apparatus, and a sensor jig for acquiring teaching information. In particular, the present invention relates to a transport apparatus, a position teaching method, and a sensor jig for transporting a thin object, such as a semiconductor wafer, a liquid crystal panel, an organic EL panel, or a solar cell panel, as an object to be transported.

BACKGROUND ART

In the related art, during an operation of teaching a transport position to a transport apparatus that transports a thin object, such as a semiconductor wafer, a liquid crystal panel, an organic EL panel, or a solar cell panel, the operator arranges an object to be transported (transport object) or a teaching jig at a transport destination (transport port), guides the transport apparatus to the transport position, and visually checks the teaching position. Therefore, it takes much time to perform the operation and the accuracy of the operation largely depends on the degree of proficiency of the operator. In addition, in many cases, it is difficult for the operator to check the transport position visually according to some type of the transport apparatus and the operator must teach in the range of movement of the transport apparatus, which is dangerous. Therefore, an auto-teaching method has been proposed which detects the transport object using various kinds of sensors or teaching jigs and automatically teaches the transport position to the transport apparatus.

For example, Patent Document 1 discloses a method in which a teaching jig is provided at a position where a semiconductor wafer will be disposed and the teaching jig is detected by a transmissive sensor that is provided at the leading end of the hand of a robot (transport apparatus), thereby teaching the position of the semiconductor wafer. In addition, Patent Document 2 discloses a system that detects an object provided at the transport position in a non-contact manner using an optical sensor which is attached to the arm of the transport apparatus and acquires the teaching information of the transport position from the position information of the detected object.

Patent Document 1: International publication No. WO/2003/022534
Patent Document 2: Japanese Patent No. 3306398

DISCLOSURE OF THE INVENTION

Problems to be solved by the Invention

However, in the methods according to the related art, since the transmissive sensor having the expansion and contraction direction (Y direction) of the arm of the transport apparatus and a direction (X direction) substantially perpendicular to the expansion and contraction direction as the optical axes is used, an avoiding operation different from a normal transport operation is performed in order to acquire the teaching information. For example, the avoiding operation for rectilinear movement in the X direction and the Y direction needs to be performed in order to acquire position information in the X direction and the Y direction using different operations and calculate the teaching information of the transport position. Therefore, during the actual transport operation, it is necessary to correct the backlash of each axis of the transport apparatus caused by the difference between the avoiding operation and the transport operation.

In addition, it is necessary for the operator to visually check whether the operation is available rather than all operations are automatically performed even in the auto-teaching mode.

The invention has been made in order to solve the above-mentioned problems and an object of the invention is to provide a transport apparatus that holds and transports an object on a predetermined transport track using a transport portion provided at the leading end of an arm and is capable of acquiring the teaching information of a transport position using a general transport operation, a position teaching method, and a sensor jig.

Means for Solving the Problems

The following invention is provided in order to solve the above-mentioned problems of the related art.

A transport apparatus of a first aspect of the invention has a vertical motion in a vertical direction, and a rectilinear motion and a rotary motion in a plane perpendicular to the vertical direction. When the vertical direction is a Z direction, a rectilinear direction in terms of the design on the plane is a Y direction, and a direction perpendicular to the Y direction and the Z direction is an X direction, the transport apparatus includes: a transport portion that is provided at the leading end of an arm, holds an object, and transports the object on a predetermined transport track; a transmissive sensor including light emitting portions and light receiving portions that are arranged such that one or more optical axes are formed from the light emitting portions to the light receiving portions, the optical axes are not parallel to each other on a projection plane including desired two directions among the X direction, the Y direction, and the Z direction when there is a plurality of optical axes, and at least one of the plurality of optical axes is not parallel to the desired two directions; one or more target members that can shield the optical axes; a teaching information calculating unit that acquires, from the transmissive sensor, position information when the target member is changed from a light transmission state in which the target member does not shield the optical axis to a light shielding state in which the target member shields the optical axis or from the light shielding state to the light transmission state and calculates teaching information on a predetermined target position on the transport track on the basis of the acquired position information; and a control unit that controls the transport position of the object on the basis of the teaching information on the target position calculated by the teaching information calculating unit. The transmissive sensor is provided in one of a leading end portion of the transport portion and a neighboring portion of the target position, and the target members are provided in the other one of the leading end portion of the transport portion and the neighboring portion of the target position where the transmissive sensor is not provided.

According to the above-mentioned structure, it is possible to acquire the teaching information of the transport position by a general transport operation of the transport apparatus, that is, without an avoiding operation for a teaching operation. For example, it is possible to acquire position information in the X direction and the Y direction by the expansion and contraction of the arm and calculate the teaching information of the transport position. Therefore, it is possible to calculate the teaching information without considering the backlash of each axis of the transport apparatus. That is, it is possible to calculate the teaching information with a simple method and reduce the calculation time.

The arm is configured with a long length by connecting the leading end portions and the base end portions of a plurality of members and integrating the members and can be expanded and contracted by a driving source. An object transport portion is provided at the leading end of the arm and includes a known grip mechanism which determines the position of a transport object at a predetermined position on the leading end.

The target member may be a member that has already been provided at the leading end of the transport portion or in the vicinity of the target position or a member that is attached to a light shielding jig provided at the leading end of the transport portion or in the vicinity of the target position. It is most preferable that the target member have a cylindrical (pin) shape.

The transmissive sensor is attached to a sensor jig that is provided at the leading end of the transport portion or in the vicinity of the target position.

The vertical direction is the Z direction, a rectilinear direction in terms of the design on the plane perpendicular to the vertical direction is the Y direction, and a direction perpendicular to the Y direction and the Z direction is the X direction. Therefore, the X direction, the Y direction, and the Z direction are directions in terms of the design. The R direction is the rectilinear direction of the transport portion (the leading end portion of the arm). The rotation center axis of the transport portion is referred to as a θ-axis.

According to the transport apparatus of a second aspect of the invention, in the transport apparatus according to the first aspect of the invention, the number of target members may be two or more. It is preferable that the angel between the direction of an S-axis passing through the centers of at least two target members and the Y direction or the X direction be known and the relative positions of the target members be known.

According to the above-mentioned structure, it is possible to acquire high-accuracy teaching information. That is, it is possible to acquire accurate teaching information on the transport position by aligning the direction passing through at least two target members with a predetermined direction.

According to the transport apparatus of a third aspect of the invention, in the transport apparatus according to the second aspect of the invention, the direction of the S-axis passing through the centers of the at least two target members may be the Y direction or the X direction.

According to the above-mentioned structure, it is possible to acquire high-accuracy teaching information with simple calculation.

According to the transport apparatus of a fourth aspect of the invention, in the transport apparatus according to any one of the first to third aspects of the invention, when the rectilinear direction of the transport portion is an R direction, the teaching information calculating unit may include: a Z-axis correction information calculating unit that calculates the teaching information for correcting the target position in the Z direction on the basis of the position information obtained when the optical axes are moved in the Z direction relative to one of the target members and one of the optical axes is shielded by the target member; a θ-axis correction information calculating unit that calculates the teaching information for correcting the angular deviation between the R direction and the Y direction on the basis of the position information when the optical axes are relatively moved in parallel until one of the optical axes is shielded by one of the target members and the position information when the optical axis is moved in parallel relative to the target member in the X direction until the optical axis is in the light transmission state; an X-axis correction information calculating unit that calculates the teaching information for correcting the target position in the X direction on the basis of each position information when the number of optical axes is two, two optical axes are moved in parallel relative to one of the target members in the R direction, and the two optical axes are shielded; and a Y-axis correction information calculating unit that calculates the teaching information for correcting the target position in the R direction on the basis of each position information when the number of optical axes is two, two optical axes are moved in parallel relative to one of the target members in the R direction, the two optical axes intersect each other, and the two optical axes are shielded, and the position information when the two optical axes do not intersect each other and at least one of the optical axes is shielded.

In the transport apparatus, the Z-axis correction information calculating unit calculates the position correction value of the transport position in the Z-axis direction, the θ-axis correction information calculating unit calculates a correction value for aligning the rectilinear direction (R direction) of the transport portion with the Y direction (hereinafter, referred to as θ-axis correction), that is, for moving the transport portion straight in the Y direction, the X-axis correction information calculating unit calculates the position correction value of the transport position in the X-axis direction, and the Y-axis correction information calculating unit calculates the position correction value of the transport position in the Y-axis direction.

According to the above-mentioned structure, it is possible to calculate teaching information for correcting the position of the transport apparatus in the Z-axis direction, the θ-axis direction, the X-axis direction, and the Y direction for the transport position by repeatedly performing a general transport operation.

According to the transport apparatus of a fifth aspect of the invention, in the transport apparatus according to the fourth aspect of the invention, when the number of target members is two or more, one of the target members passing through the S-axis is a first target member, and the target member other than the first target member is a second target member, the teaching information calculating unit may include an S-axis correction information calculating unit, and the S-axis correction information calculating unit may perform the following operations: when there are two optical axes that are not parallel to each other on the projection plane and the S-axis is the Y direction, the S-axis correction information calculating unit calculates the teaching information for correcting the angular deviation between the S-axis and the Y direction on the basis of each position information when one of the optical axes is moved in parallel relative to the second target member from the center of the first target member in the R direction and the two optical axes are shielded; when there are two optical axes that are not parallel to each other on the projection plane and the S-axis is the X direction, the S-axis correction information calculating unit calculates the teaching information for correcting the angular deviation between the S-axis and the X direction on the basis of each position information when one of the optical axes is moved in parallel relative to the second target member from the center of the first target member in the X direction and the two optical axes are shielded; and when there are two optical axes that are not parallel to each other on the projection plane and the S-axis is different from the X direction and the Y direction, the S-axis correction information calculating unit calculates the teaching information for correcting the angular deviation between the Y direction calculated from the S-axis in terms of installation and the Y direction in terms of the design on the basis of each position information when one of the optical axes is moved in parallel relative to the second target member from the center of the first target member in the R direction and the two optical axes are shielded.

In the transport apparatus, the S-axis correction information calculating unit calculates a correction value for aligning, for example, a central axis (S-axis) passing through the target position, which is the Y direction in terms of installation, with the rectilinear direction (R direction) of the transport portion. That is, since the O-axis correction information calculating unit corrects the R direction to be aligned with the Y direction, the S-axis correction information calculating unit calculates a correction value for aligning the S-axis with the Y direction. Alternatively, the S-axis correction information calculating unit calculates a correction value for aligning, for example, a central axis (S-axis) passing through the target position, which is the X direction in terms of installation, with the X direction in terms of the design. That is, the S-axis correction information calculating unit calculates a correction value for aligning the S-axis with the X direction.

According to the above-mentioned structure, it is possible to calculate teaching information for correcting the central axis of the transport position in the Y direction or teaching information for correcting the central axis of the transport position in the X direction by repeatedly performing the general transport operation.

A transport apparatus of a sixth aspect of the invention has a vertical motion in a vertical direction, and a rectilinear motion and a rotary motion in a plane perpendicular to the vertical direction. When the vertical direction is a Z direction, a rectilinear direction in terms of the design on the plane is a Y direction, and a direction perpendicular to the Y direction and the Z direction is an X direction, the transport apparatus includes: a transport portion that is provided at the leading end of an arm, holds an object, and transports the object on a predetermined transport track; a transmissive sensor including light emitting portions and light receiving portions that are arranged such that one or more optical axes are formed from the light emitting portions to the light receiving portions, the optical axes are not parallel to each other on a projection plane including desired two directions among the X direction, the Y direction, and the Z direction when there is a plurality of optical axes, and at least one of the plurality of optical axes is not parallel to the desired two directions; one or more target members that can shield the optical axes; one or more temporary correction target members whose positions relative to the target members that can shield the optical axes are known; a teaching information calculating unit that acquires, from the transmissive sensor, position information when the target members and the temporary correction target members are changed from a light transmission state in which they do not shield the optical axes to a light shielding state in which they shield the optical axes or from the light shielding state to the light transmission state and calculates teaching information on a predetermined target position on the transport track on the basis of the acquired position information; and a control unit that controls the transport position of the object on the basis of the teaching information on the target position calculated by the teaching information calculating unit. The transmissive sensor is provided in one of a leading end portion of the transport portion and a neighboring portion of the target position, and the target members and the temporary correction target members are provided in the other one of the leading end portion of the transport portion and the neighboring portion of the target position where the transmissive sensor is not provided. The temporary correction target members are provided between the transmissive sensor and the target members.

According to the above-mentioned structure, it is possible to acquire the teaching information of the transport position by the general transport operation of the transport apparatus, that is, without the avoiding operation for a teaching operation. For example, it is possible to acquire position information in the X direction and the Y direction by the expansion and contraction of the arm and calculate the teaching information of the transport position. Therefore, it is possible to calculate the teaching information without considering the backlash of each axis of the transport apparatus. That is, it is possible to calculate the teaching information with a simple method and reduce the calculation time.

Even though a spatial area in the vicinity of the transport position is narrow and the transport portion is likely to collide with a member, such as an apparatus disposed in the vicinity of the transport position, when the wafer transport apparatus is operated in order to acquire the teaching information on the transport position, it is possible to acquire the teaching information on the transport position while preventing the contact between the transport portion and a member, such as an apparatus in the vicinity of the transport position, by providing a target member at the transport position and between the target position and the transport portion where the transport portion does not contact the member such as an apparatus disposed in the vicinity of the transport position.

According to the transport apparatus of a seventh aspect of the invention, in the transport apparatus according to the sixth aspect of the invention, the number of target members may be two or more. It is preferable that the angel between the direction of an S-axis passing through the centers of at least two target members and the Y direction or the X direction be known and the relative positions of the target members be known.

According to the above-mentioned structure, it is possible to acquire high-accuracy teaching information. That is, it is possible to acquire accurate teaching information on the transport position by aligning the direction passing through at least two target members with a predetermined direction.

According to the transport apparatus of an eighth aspect of the invention, in the transport apparatus according to the seventh aspect of the invention, the direction of the S-axis passing through the centers of the at least two target members may be the Y direction or the X direction.

According to the above-mentioned structure, it is possible to acquire high-accuracy teaching information with simple calculation.

According to the transport apparatus of a ninth aspect of the invention, in the transport apparatus according to any one of the sixth to eighth aspects of the invention, when the rectilinear direction of the transport portion is an R direction, the teaching information calculating unit may include: a Z-axis correction information calculating unit that calculates the teaching information for correcting the target position in the Z direction on the basis of the position information when the optical axes are moved in the Z direction relative to the temporary correction target members and one of the optical axes is shielded by the temporary correction target members; a θ-axis correction information calculating unit that calculates the teaching information for correcting the angular deviation between the R direction and the Y direction on the basis of the position information when the optical axes are relatively moved in parallel until one of the optical axes is shielded by the temporary correction target members and the position information when the optical axis is moved in parallel relative to the temporary correction target members in the X direction until the optical axis is in the light transmission state; a primary X-axis correction information calculating unit that calculates the teaching information for correcting the target position in the X direction on the basis of each position information when the number of optical axes is two, two optical axes are moved in parallel relative to the temporary correction target members in the R direction, and the two optical axes are shielded; and a Y-axis correction information calculating unit that calculates the teaching information for correcting the target position in the R direction on the basis of each position information when the number of optical axes is two, two optical axes are moved in parallel relative to one of the target members in the R direction, the two optical axes intersect each other, and the two optical axes are shielded, and the position information when the two optical axes do not intersect each other and at least one of the optical axes is shielded.

In the transport apparatus, the Z-axis correction information calculating unit calculates the position correction value of the transport position in the Z-axis direction, the θ-axis correction information calculating unit calculates a correction value for aligning the rectilinear direction (R direction) of the transport portion with the Y direction (hereinafter, referred to as θ-axis correction), that is, for moving the transport portion straight in the Y direction, the X-axis correction information calculating unit calculates the position correction value of the transport position in the X-axis direction, and the Y-axis correction information calculating unit calculates the position correction value of the transport position in the Y-axis direction.

According to the above-mentioned structure, it is possible to calculate teaching information for correcting the position of the transport apparatus in the Z-axis direction, the θ-axis direction, the X-axis direction, and the Y direction for the transport position by repeatedly performing a general transport operation.

According to the transport apparatus of a tenth aspect of the invention, in the transport apparatus according to according to the ninth aspect, when the number of target members is two or more, one of the target members passing through the S-axis is a first target member, and the target member other than the first target member is a second target member, the teaching information calculating unit may include an S-axis correction information calculating unit and a secondary X-axis correction information calculating unit, and the S-axis correction information calculating unit and the secondary X-axis correction information calculating unit may perform the following operations. When there are two optical axes that are not parallel to each other on the projection plane and the S-axis is the Y direction, the S-axis correction information calculating unit calculates the teaching information for correcting the angular deviation between the S-axis and the Y direction on the basis of each position information when one of the optical axes is moved in parallel relative to the second target member from the center of the first target member in the R direction and the two optical axes are shielded. When there are two optical axes that are not parallel to each other on the projection plane and the S-axis is the X direction, the S-axis correction information calculating unit calculates the teaching information for correcting the angular deviation between the S-axis and the X direction on the basis of each position information when one of the optical axes is moved in parallel relative to the second target member from the center of the first target member in the X direction and the two optical axes are shielded. When there are two optical axes, the secondary X-axis correction information calculating unit calculates the teaching information for correcting the target position in the X direction on the basis of each position information when the two optical axes are moved in parallel relative to one of the target members in the R direction and the two optical axes are shielded. When there are two optical axes that are not parallel to each other on the projection plane and the S-axis is different from the X direction and the Y direction, the secondary X-axis correction information calculating unit calculates the teaching information for correcting the angular deviation between the Y direction calculated from the S-axis in terms of installation and the Y direction in terms of the design on the basis of each position information when one of the optical axes is moved in parallel relative to the second target member from the center of the first target member in the R direction and the two optical axes are shielded.

In the transport apparatus, the S-axis correction information calculating unit calculates a correction value for aligning, for example, a central axis (S-axis) passing through the target position, which is the Y direction in terms of installation, with the rectilinear direction (R direction) of the transport portion. That is, since the O-axis correction information calculating unit corrects the R direction to be aligned with the Y direction, the S-axis correction information calculating unit calculates a correction value for aligning the S-axis with the Y direction. Alternatively, the S-axis correction information calculating unit calculates a correction value for aligning, for example, a central axis (S-axis) passing through the target position, which is the X direction in terms of installation, with the X direction in terms of the design. That is, the S-axis correction information calculating unit calculates a correction value for aligning the S-axis with the X direction.

The secondary X-axis correction information calculating unit calculates the accurate position correction value of the transport position in the X-axis direction.

According to the above-mentioned structure, it is possible to calculate teaching information for correcting the central axis of the transport position in the Y direction or the central axis of the transport position in the X direction, and for correcting the position in the X direction by repeatedly performing the general transport operation.

A position teaching method of a first aspect of the invention teaches a predetermined target position on a transport track to a transport apparatus that holds and transports an object on a predetermined transport track using a transport portion provided at the leading end of an arm and has a vertical motion in a vertical direction, and a rectilinear motion and a rotary motion in a plane perpendicular to the vertical direction. When the vertical direction is a Z direction, a rectilinear direction in terms of the design on the plane is a Y direction, and a direction perpendicular to the Y direction and the Z direction is an X direction, the position teaching method includes: (a) a step of moving a transmissive sensor, which is provided in one of a leading end portion of the transport portion and a neighboring portion of the target position and includes light emitting portions and light receiving portions arranged such that one or more optical axes are formed from the light emitting portions to the light receiving portions, the optical axes are not parallel to each other on a projection plane including desired two directions among the X direction, the Y direction, and the Z direction when there is a plurality of optical axes, and at least one of the plurality of optical axes is not parallel to the desired two directions, relative to one or more target members that are provided in the other one of the leading end portion of the transport portion and the neighboring portion of the target position where the transmissive sensor is not provided, thereby acquiring position information when the target member is changed from a light transmission state in which the target member does not shield the optical axis to a light shielding state in which the target member shields the optical axis or from the light shielding state to the light transmission state, and calculating teaching information on the target position on the basis of the acquired position information.

According to the above-mentioned aspect, it is possible to obtain the same effects as those of the transport apparatus according to the first aspect of the invention.

According to the position teaching method of a second aspect of the invention, in the position teaching method according to the first aspect of the invention, the number of target members may be two or more, and it is preferable that the angel between the direction of an S-axis passing through the centers of at least two target members and the Y direction or the X direction be known and the relative positions of the target members be known.

According to the above-mentioned aspect, it is possible to obtain the same effects as those of the transport apparatus according to the second aspect of the invention.

According to the position teaching method of a third aspect of the invention, in the position teaching method according to the second aspect of the invention, the direction of the S-axis passing through the centers of the at least two target members may be the Y direction or the X direction.

According to the above-mentioned aspect, it is possible to obtain the same effects as those of the transport apparatus according to the third aspect of the invention.

According to the position teaching method of a fourth aspect of the invention, in the position teaching method according to any one of the first to third aspects of the invention, when the rectilinear direction of the transport portion is an R direction, the step (a) may include at least one of the following four steps: (b) a step of calculating the teaching information for correcting the target position in the Z direction on the basis of the position information when the optical axes are moved in the Z direction relative to one of the target members and one of the optical axes is shielded by the target member; (c) a step of calculating the teaching information for correcting the angular deviation between the R direction and the Y direction on the basis of the position information when the optical axes are relatively moved in parallel until one of the optical axes is shielded by one of the target members and the position information when the optical axis is moved in parallel relative to the target member in the X direction until the optical axis is in the light transmission state; (d) a step of calculating the teaching information for correcting the target position in the X direction on the basis of each position information when the number of optical axes is two, two optical axes are moved in parallel relative to one of the target members in the R direction, and the two optical axes are shielded; and (e) a step of calculating the teaching information for correcting the target position in the R direction on the basis of each position information when the number of optical axes is two, two optical axes are moved in parallel relative to one of the target members in the R direction, the two optical axes intersect each other, and the two optical axes are shielded, and the position information when the two optical axes do not intersect each other and at least one of the optical axes is shielded.

According to the above-mentioned aspect, it is possible to obtain the same effects as those of the transport apparatus according to the fourth aspect of the invention.

According to the position teaching method of a fifth aspect of the invention, in the position teaching method according to any one of the first to fourth aspects of the invention, when the number of target members is two or more, one of the target members passing through the S-axis is a first target member, and the target member other than the first target member is a second target member, the step (a) may include at least one of the following two steps: (f) a step of calculating the teaching information for correcting the angular deviation between the S-axis and the Y direction on the basis of each position information when one of two optical axes is moved in parallel relative to the second target member from the center of the first target member in the R direction and the two optical axes are shielded, if there are the two optical axes that are not parallel to each other on the projection plane and the S-axis is the Y direction, calculating the teaching information for correcting the angular deviation between the S-axis and the X direction on the basis of each position information when one of two optical axes is moved in parallel relative to the second target member from the center of the first target member in the X direction and the two optical axes are shielded, if there are the two optical axes that are not parallel to each other on the projection plane and the S-axis is the X direction, and calculating the teaching information for correcting the angular deviation between the Y direction calculated from the S-axis in terms of installation and the Y direction in terms of the design on the basis of each position information when one of two optical axes is moved in parallel relative to the second target member from the center of the first target member in the R direction and the two optical axes are shielded, if there are the two optical axes that are not parallel to each other on the projection plane and the S-axis is different from the X direction and the Y direction; and (g) a step of calculating the teaching information for correcting the target position in the X direction on the basis of each position information when there are two optical axes, the two optical axes are moved in parallel relative to one of the target members in the R direction, and the two optical axes are shielded.

According to the above-mentioned aspect, it is possible to obtain the same effects as those of the transport apparatus according to the fifth aspect of the invention.

A position teaching method of a sixth aspect of the invention teaches a predetermined target position on a transport track to a transport apparatus that holds and transports an object on a predetermined transport track using a transport portion provided at the leading end of an arm and has a vertical motion in a vertical direction, and a rectilinear motion and a rotary motion in a plane perpendicular to the vertical direction. When the vertical direction is a Z direction, a rectilinear direction in terms of the design on the plane is a Y direction, and a direction perpendicular to the Y direction and the Z direction is an X direction, the position teaching method includes (a1) a step of moving a transmissive sensor, which is provided in one of a leading end portion of the transport portion and a neighboring portion of the target position and includes light emitting portions and light receiving portions arranged such that one or more optical axes are formed from the light emitting portions to the light receiving portions, the optical axes are not parallel to each other on a projection plane including desired two directions among the X direction, the Y direction, and the Z direction when there is a plurality of optical axes, and at least one of the plurality of optical axes is not parallel to the desired two directions, relative to one or more target members that are provided in the other one of the leading end portion of the transport portion and the neighboring portion of the target position where the transmissive sensor is not provided and one or more temporary correction target members which are provided between the target members and the transmissive sensor in the other one of the leading end portion of the transport portion and the neighboring portion of the target position where the transmissive sensor is not provided and whose positions relative to the target members are known, thereby acquiring position information when the target members and the temporary correction target members are changed from a light transmission state in which they do not shield the optical axes to a light shielding state in which they shield the optical axes or from the light shielding state to the light transmission state, and calculating teaching information on the target position on the basis of the acquired position information.

According to the above-mentioned aspect, it is possible to obtain the same effects as those of the transport apparatus according to the sixth aspect of the invention.

According to the position teaching method of a seventh aspect of the invention, in the position teaching method according to the sixth aspect of the invention, the number of target members may be two or more, and it is preferable that the angel between the direction of an S-axis passing through the centers of at least two target members and the Y direction or the X direction be known and the relative positions of the target members be known.

According to the above-mentioned aspect, it is possible to obtain the same effects as those of the transport apparatus according to the seventh aspect of the invention.

According to the position teaching method of an eighth aspect of the invention, in the position teaching method according to the seventh aspect of the invention, the direction of the S-axis passing through the centers of the at least two target members may be the Y direction or the X direction.

According to the above-mentioned aspect, it is possible to obtain the same effects as those of the transport apparatus according to the eighth aspect of the invention.

According to the position teaching method of a ninth aspect of the invention, in the position teaching method according to any one of the sixth to eighth aspects of the invention, when the rectilinear direction of the transport portion is an R direction, the step (a1) may include at least one of the following four steps: (b1) a step of calculating the teaching information for correcting the target position in the Z direction on the basis of the position information when the optical axes are moved in the Z direction relative to the temporary correction target members and one of the optical axes is shielded by the temporary correction target members; (c1) a step of calculating the teaching information for correcting the angular deviation between the R direction and the Y direction on the basis of the position information when the optical axes are relatively moved in parallel until one of the optical axes is shielded by the temporary correction target members and the position information when the optical axis is moved in parallel relative to the temporary correction target members in the X direction until the optical axis is in the light transmission state; (d1) a step of calculating the teaching information for correcting the target position in the X direction on the basis of each position information when the number of optical axes is two, two optical axes are moved in parallel relative to the temporary correction target members in the R direction, and the two optical axes are shielded; and (e1) a step of calculating the teaching information for correcting the target position in the R direction on the basis of each position information when the number of optical axes is two, two optical axes are moved in parallel relative to one of the target members in the R direction, the two optical axes intersect each other, and the two optical axes are shielded, and the position information when the two optical axes do not intersect each other and at least one of the optical axes is shielded.

According to the above-mentioned aspect, it is possible to obtain the same effects as those of the transport apparatus according to the ninth aspect of the invention.

According to the position teaching method of a tenth aspect of the invention, in the position teaching method according to any one of the sixth to ninth aspects of the invention, when the number of target members is two or more, one of the target members passing through the S-axis is a first target member, and the target member other than the first target member is a second target member, the step (a1) may include at least one of the following two steps: (f1) a step of calculating the teaching information for correcting the angular deviation between the S-axis and the Y direction on the basis of each position information when one of two optical axes is moved in parallel relative to the second target member from the center of the first target member in the R direction and the two optical axes are shielded, if there are the two optical axes that are not parallel to each other on the projection plane and the S-axis is the Y direction, calculating the teaching information for correcting the angular deviation between the S-axis and the X direction on the basis of each position information when one of two optical axes is moved in parallel relative to the second target member from the center of the first target member in the X direction and the two optical axes are shielded, if there are the two optical axes that are not parallel to each other on the projection plane and the S-axis is the X direction, and calculating the teaching information for correcting the angular deviation between the Y direction calculated from the S-axis in terms of installation and the Y direction in terms of the design on the basis of each position information when one of two optical axes is moved in parallel relative to the second target member from the center of the first target member in the R direction and the two optical axes are shielded, if there are the two optical axes that are not parallel to each other on the projection plane and the S-axis is different from the X direction and the Y direction; and (g) a step of calculating the teaching information for correcting the target position in the X direction on the basis of each position information when there are two optical axes, the two optical axes are moved in parallel relative to one of the target members in the R direction, and the two optical axes are shielded.

According to the above-mentioned aspect, it is possible to obtain the same effects as those of the transport apparatus according to the tenth aspect of the invention.

A sensor jig of a first aspect of the invention is moved in parallel relative to a target member and detects the target member. The sensor jig includes a transmissive sensor having one or more optical axes from light emitting portions to the light receiving portions. When a plurality of optical axes is formed, the light emitting portions and the light receiving portions are arranged such that the optical axes are not parallel to each other on the same projection plane and at least one of the plurality of optical axes is not parallel to a relative movement direction to the target member which is projected onto the projection plane and a direction perpendicular to the movement direction.

The sensor jig is provided at the leading end of the transport portion of the transport apparatus that transports an object on a predetermined transport track or in the vicinity of a predetermined target position on the transport track. In this way, it is possible to obtain the same effects as those of the transport apparatus according to any one of the first to tenth aspects of the invention.

A transport apparatus of an eleventh aspect of the invention has a vertical motion in a vertical direction, and a rectilinear motion and a rotary motion in a plane perpendicular to the vertical direction. The transport apparatus includes: a transport portion that is provided at the leading end of an arm, holds an object, and transports the object on a predetermined transport track; and the sensor jig according to the first aspect of the invention. Teaching information on a predetermined target position on the transport track is calculated on the basis of position information when the target member is changed from a light transmission state in which the target member does not shield the optical axis to a light shielding state in which the target member shields the optical axis or from the light shielding state to the light transmission state which is acquired by the transmissive sensor of the sensor jig.

According to the above-mentioned aspect, it is possible to obtain the same effects as those of the transport apparatus according to any one of the first to tenth aspects of the invention.

Effects of the Invention

According to the invention, it is possible to acquire the teaching information of the transport position by a general transport operation of the transport apparatus, that is, without an avoiding operation for a teaching operation. For example, it is possible to acquire position information in the X direction and the Y direction by the expansion and contraction of the arm and calculate the teaching information of the transport position. Therefore, it is possible to calculate the teaching information without considering the backlash of each axis of the transport apparatus. That is, it is possible to easily calculate the teaching information and reduce the calculation time.

Even though a spatial area in the vicinity of the transport position is narrow and the transport portion is likely to collide with a member, such as an apparatus disposed in the vicinity of the transport position, when the wafer transport apparatus is operated in order to acquire the teaching information on the transport position, it is possible to acquire the teaching information on the transport position while preventing the contact between the transport portion and a member, such as an apparatus in the vicinity of the transport position, by providing a target member at the transport position and between the target position and the transport portion where the transport portion does not contact the member such as an apparatus disposed in the vicinity of the transport position.

BRIEF DESCRIPTION OF THE DRAWINGS

FIG. 1 is a diagram illustrating a transport apparatus according to an embodiment of the invention.

DESCRIPTION OF REFERENCE NUMERALS AND SIGNS

Figure 2:
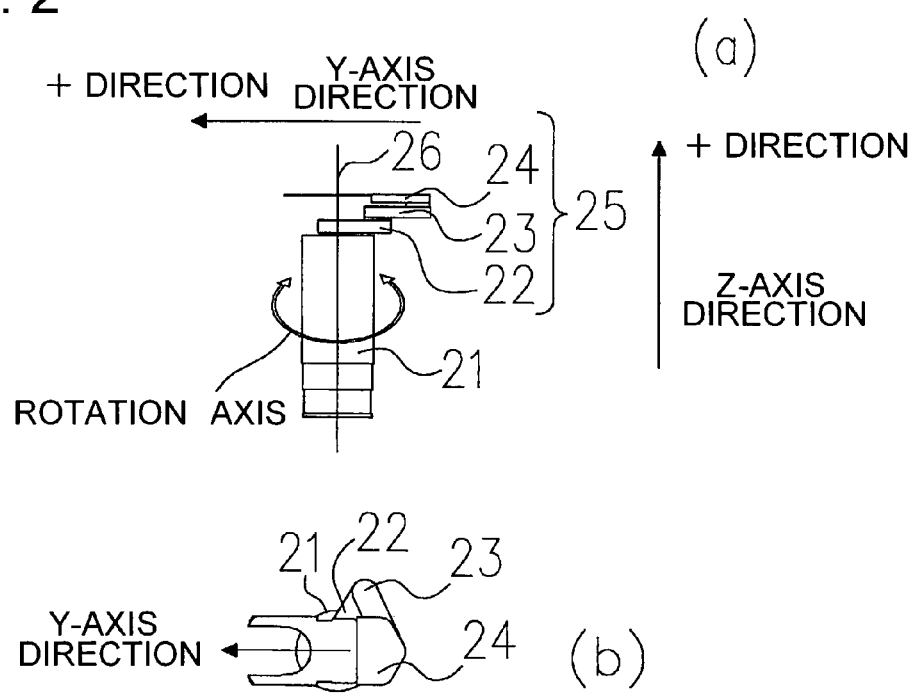
FIG. 2 is a diagram illustrating a transport robot 12.

10: WAFER TRANSPORT APPARATUS
150: WAFER CONTAINER
12: TRANSPORT ROBOT (MAIN PART)
11: LOAD PORT
13: X-AXIS TABLE
21: SUPPORTING PORTION
22: FIRST ARM
23: SECOND ARM
24: WAFER TRANSPORT PORTION
25: ROTATING PORTION
30: SENSOR JIG
32: TRANSMISSIVE SENSOR
41, 42: THE OPTICAL AXIS
50: LIGHT SHIELDING JIG
51, 52: LIGHT SHIELDING PIN
60: TEACHING INFORMATION CALCULATING UNIT
61: Z-AXIS CORRECTION INFORMATION CALCULATING UNIT
62: θ-AXIS CORRECTION INFORMATION CALCULATING UNIT
63: X-AXIS CORRECTION INFORMATION CALCULATING UNIT
64: Y-AXIS CORRECTION INFORMATION CALCULATING UNIT
65: S-AXIS CORRECTION INFORMATION CALCULATING UNIT
70: CONTROL UNIT
75: DRIVING UNIT
76: WIRELESS SIGNAL TRANSMITTER
77: BATTERY

BEST MODE FOR CARRYING OUT THE INVENTION

Hereinafter, an embodiment of the invention will be described with reference to the accompanying drawings. The following embodiment is just illustrative, but does not limit the scope of the invention. Therefore, it will be understood by those skilled in the art that each component or all components of the embodiment can be replaced with its equivalent or their equivalents and the embodiments including the equivalents are also included in the scope of the invention.

A transport apparatus of automatically teaching (auto-teaching) a predetermined transport position (target position) on a transport track to the transport apparatus that transports an object along a predetermined transport track will be described below.

FIG. 1 is a diagram illustrating a transport apparatus according to an embodiment of the invention. Specifically, FIG. 1(a) is a schematic top view and FIG. 1(b) is a schematic side view. Hereinafter, a wafer transport apparatus (EFEM: Equipment Front End Module) that transports a wafer between a wafer container (FOUP) having semiconductor wafers accommodated therein and a wafer processing apparatus is given as an example of the transport apparatus.

As shown in FIG. 1, a wafer transport apparatus 10 transports a wafer between a wafer container 150 and a wafer processing apparatus 100. The wafer transport apparatus 10 includes a main portion (transport robot) 12 that holds a semiconductor wafer, a load port 11, and an X-axis table 13. The load port 11 includes the wafer container 150. The transport robot 12 opens the door (not shown) of the wafer container 150 and moves the semiconductor wafer in the wafer container 150 to a position where the semiconductor wafer can be transported. The X-axis table 13 on which the transport robot 12 is provided moves the transport robot 12 in parallel to the X-axis direction (X direction) perpendicular to the vertical direction (Z direction) of FIGS. 1(a) and 1(b).

A direction perpendicular to the Z direction and the X direction is the Y direction. Here, the X direction, the Y direction, and the Z direction are the directions of the wafer transport apparatus 10 in terms of the design, and the X-axis direction, the Y-axis direction, and the Z-axis direction correspond to the X direction, the Y direction, and the Z direction of the wafer transport apparatus 10 in terms of installation.

Next, the transport robot 12 will be described with reference to FIG. 2. FIG. 2 is a diagram illustrating the transport robot 12. Specifically, FIG. 2(a) is a side view schematically illustrating the transport robot 12 and FIG. 2(b) is a top view schematically illustrating the transport robot 12.

As shown in FIG. 2, the transport robot 12 includes a cylindrical supporting portion 21 that can be vertically moved in the Z-axis direction and a rotating portion 25 that is rotated on a central axis 26 of the supporting portion 21 in a plane (rotational plane) vertical to the Z-axis direction. The rotating portion 25 includes a first arm 22, a second arm 23, and a wafer transport portion 24. The first arm 22 is attached to the supporting portion 21 so as to be rotatable on the central axis 26 of the supporting portion 21 in the rotational plane. The second arm 23 is attached to the leading end of the first arm 22 so as to be rotatable in the plane parallel to the rotational plane at a constant speed ratio with respect to the first arm 22. The wafer transport portion 24 is attached to the leading end of the second arm 23 in the plane parallel to the rotational plane at a constant speed ratio with respect to the second arm 23.

The rotary motion of the rotating portion 25 on the central axis 26 of the first arm 22 at a constant speed ratio is transmitted to the second arm 23 and the wafer transport portion 24 and is converted into the expansion and contraction motion in a direction (R direction) vertical to the central axis 26 through the central axis 26 of the wafer transport portion 24. However, the wafer transport apparatus 10 is attached to the X-axis table 13 such that the R direction of the transport robot 12 is the Y direction. Therefore, the R direction is the Y-axis direction.

Therefore, as shown in FIGS. 1 and 2, the transport robot 12 has three degrees of freedom, that is, a rotating movement on the central axis 26 of the rotating portion 25 (rotating movement), a Y-axis movement (rectilinear movement) in which the rotating portion 25 is expanded and contracted in the Y-axis direction, and a Z-axis movement in which the rotating portion 25 is vertically moved in the Z-axis direction (vertical movement). The X-axis table 13 has one degree of freedom, that is, an X-axis movement (parallel movement) in which the transport robot 12 is moved in the X-axis direction. Therefore, the wafer transport apparatus 10 has four degrees of freedom.

Next, a sensor jig and a light shielding jig that are attached to the wafer transport apparatus 10 and acquire teaching information on a transport position (target position) will be described with reference to FIGS. 3, 4 and 5.

Figure 3:
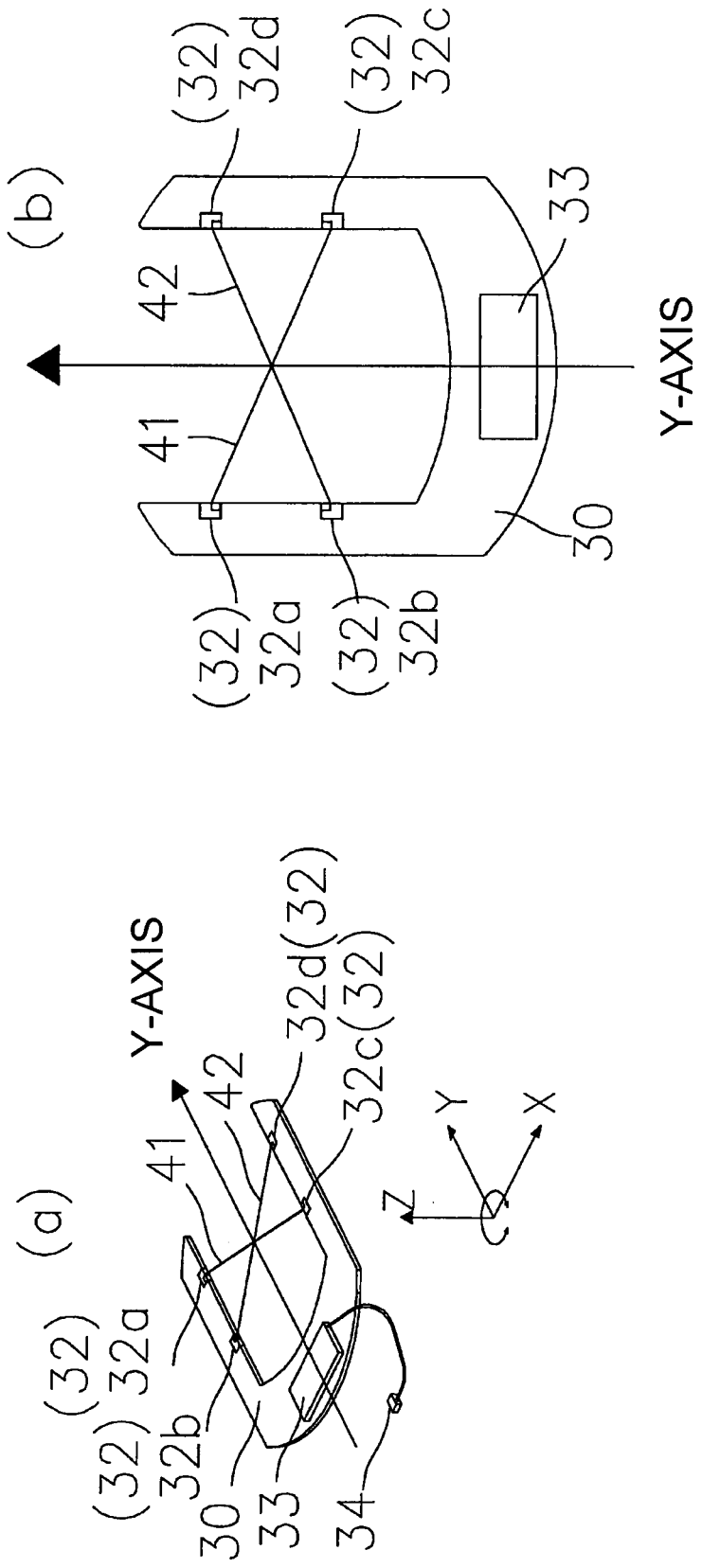
FIG. 3 is a diagram illustrating an example of a sensor jig.

FIG. 3 is a diagram illustrating an example of the sensor jig. Specifically, FIG. 3(a) is a perspective view schematically illustrating the sensor jig and FIG. 3(b) is a top view schematically illustrating the sensor jig. FIG. 4 is a diagram illustrating the attachment of the sensor jig. Specifically, FIG. 4(a) is a perspective view schematically illustrating the attachment of the sensor jig and FIG. 4(b) is a top view schematically illustrating the attachment of the sensor jig. FIG. 5 is a diagram illustrating an example of the light shielding jig. Specifically, FIG. 5(a) is a perspective view schematically illustrating the light shielding jig, FIG. 5(b) is a top view schematically illustrating the light shielding jig when light shielding pins are aligned in the Y direction, FIG. 5(c) is a top view schematically illustrating the light shielding jig when the light shielding pins are aligned in the X direction, and FIG. 5(d) is a top view schematically illustrating the light shielding jig when the light shielding pins are aligned with a line that is inclined at an angle δ with respect to the Y direction.

As shown in FIG. 3, a sensor jig 30 is provided with a transmissive sensor 32. The transmissive sensor 32 includes light emitting portions 32a and 32b and light receiving portions 32c and 32d. Electric signals transmitted from a control unit (not shown) of the transmissive sensor 32 through a connector 34 are converted into optical signals by an amplifier 33 and the optical signals are transmitted to the light emitting portions 32a and 32b. The optical signals from the light receiving portions 32c and 32d are converted into electric signals by the amplifier 33 and the electric signals are transmitted to the control unit of the transmissive sensor 32 through the connector 34. The control unit of the transmissive sensor 32 is connected to a teaching information calculating unit 60 shown in FIG. 6, which will be described below, and each of the electric signals is transmitted between the control unit and the teaching information calculating unit 60.

Figure 4:
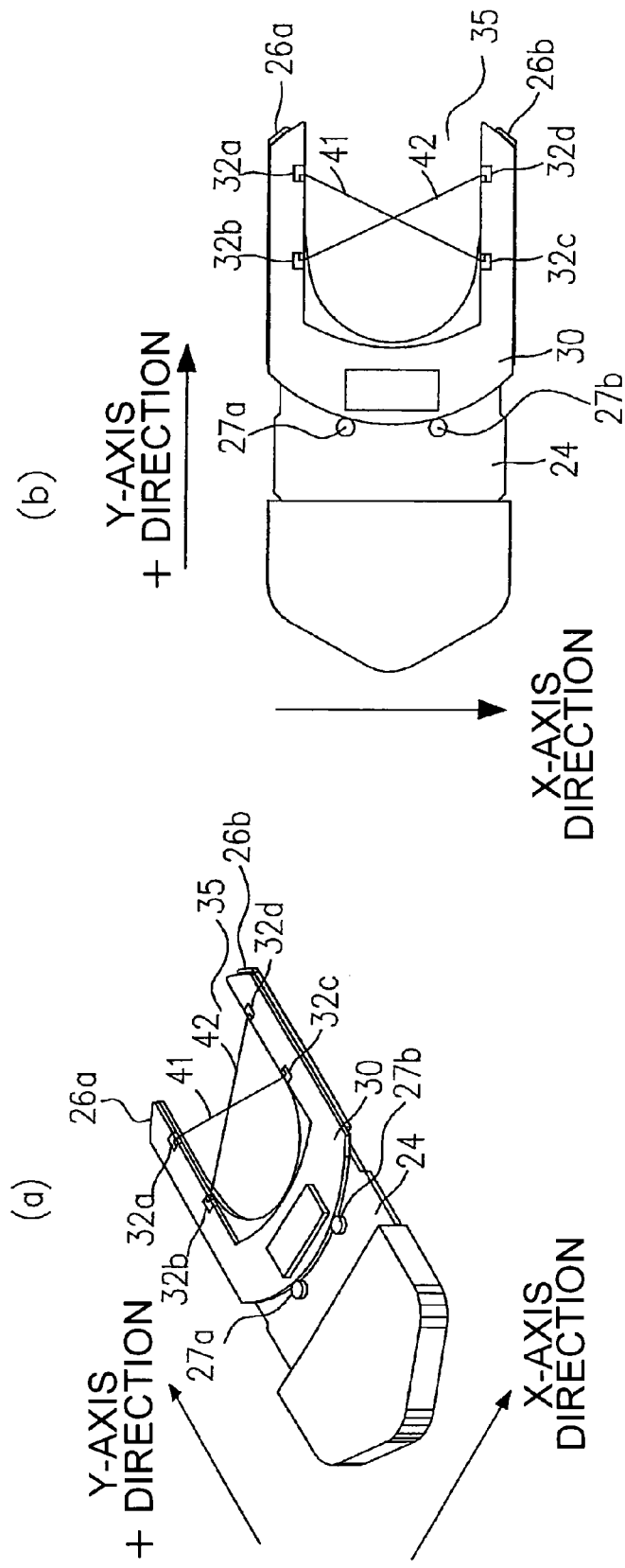
FIG. 4 is a diagram illustrating the attachment of the sensor jig.

As shown in FIG. 4, the sensor jig 30 is held by the wafer transport portion 24 such that the transmissive sensor 32 becomes the leading end portion of the wafer transport portion 24. In the wafer transport portion 24, wafer retainers 26a and 26b are fixed to two leading end portions and grippers 27a and 27b are provided at the base end so as to be movable forward or backward in the Y direction. The grippers 27a and 27b press the loaded semiconductor wafer to position the semiconductor wafer all the time. That is, instead of the semiconductor wafer, the sensor jig 30 or the light shielding jig 50 is placed and positioned on the wafer transport portion 24.

The width of the sensor jig 30 in the X direction is substantially equal to that of the wafer transport portion 24 in the X direction and the sensor jig 30 has an opening portion 35 that is substantially the same as an opening portion formed at the leading end of the wafer transport portion 24. The sensor jig 30 has a shape enabling the wafer transport portion 24 to hold the sensor jig 30, similar to the semiconductor wafer.

The light emitting portions 32a and 32b and the light receiving portions 32c and 32d of the transmissive sensor 32 are arranged on the sensor jig 30 such that the projection segments of an optical axis 41 from the light emitting portion 32a to the light receiving portion 32c and an optical axis 42 from the light emitting portion 32b to the light receiving portion 32d to a plane (hereinafter, referred to as a projection plane) parallel to the X-Y plane intersect each other and neither the projection segment of the optical axis 41 nor the projection segment of the optical axis 42 is aligned with the X-axis direction and the Y-axis direction. In addition, the light emitting portions 32a and 32b and the light receiving portions 32c and 32d are arranged on the sensor jig 30 such that the projection segments of the optical axis 41 and the optical axis 42 to the projection plane on a straight line (Y-axis) passing through the central axis 26 of the wafer transport apparatus 10 in the Y-axis direction intersect each other on the Y-axis and the projection segment of the optical axis 41 and the projection segment of the optical axis 42 are symmetric with respect to the Y-axis. Here, the structure of the transmissive sensor 32 in which the optical axis 41 and the optical axis 42 intersect with each other on the Y-axis and the projection segment of the optical axis 41 and the projection segment of the optical axis 42 are symmetric with respect to the Y-axis will be described.

In this embodiment, the projection plane is the X-Y plane, but it may be the X-Z plane or the X-Z plane.

The wafer transport portion 24 is a means for mechanically fixing the semiconductor wafer with the wafer retainers 26a and 26b and the grippers 27a and 27b. However, the wafer transport portion 24 may be various kinds of means. For example, the wafer transport portion 24 may be a means for absorbing and fixing the semiconductor wafer, and a pin or a step portion may be provided in the wafer transport portion 24 in order to fix the semiconductor wafer. That is, instead of the semiconductor wafer, the sensor jig 30 or the light shielding jig 50 is placed and positioned on the wafer transport portion 24 using a semiconductor wafer fixing means corresponding to the wafer transport portion 24.

Next, the light shielding jig will be described. As shown in FIG. 5(a), the light shielding jig 50 includes two cylindrical light shielding pins (target members) 51 and 52. For example, when the load port 11 shown in FIG. 1 is set as a transport position, the light shielding jig 50 is provided in the load port 11.

Therefore, the same positioning process as that for the rear surface of the wafer container 150 is performed on the rear surface of the light shielding jig 50 such that the light shielding jig 50 can be provided in the load port 11. However, the shape sizes and the positions of the light shielding pins 51 and 52 relative to the reference position of the light shielding jig 50 have been known. Therefore, the direction of the central axis (S-axis) passing through the centers of the light shielding pins 51 and 52 has been known. That is, as shown in FIG. 5(d), when the light shielding jig 50 is arranged at the transport position (load port 11), the angle δ between the Y direction and the central axis (S-axis) passing through the centers of the light shielding pins 51 and 52 is known, and the positions of the light shielding pins 51 and 52 relative to the reference position of the light shielding jig 50 and the shape sizes of the light shielding pins 51 and 52 is known.

For example, in the light shielding jig 50 arranged at the transport position (load port 11), when the light shielding pins 51 and 52 are arranged such that the central axis (S-axis) passing through the centers of the light shielding pins 51 and 52 is parallel to the Y direction of the wafer transport apparatus 10 as shown in FIG. 5(b), or when the light shielding pins 51 and 52 are arranged such that the S-axis is parallel to the X direction of the wafer transport apparatus 10 as shown in FIG. 5(c), it is possible to perform a correction process with a simple structure.

Next, an example in which the light shielding jig 50 is arranged at the transport position (load port 11) such that the central axis (S-axis) passing through the centers of the light shielding pins 51 and 52 is substantially parallel to the Y direction of the wafer transport apparatus 10 will be described.

Figure 6:
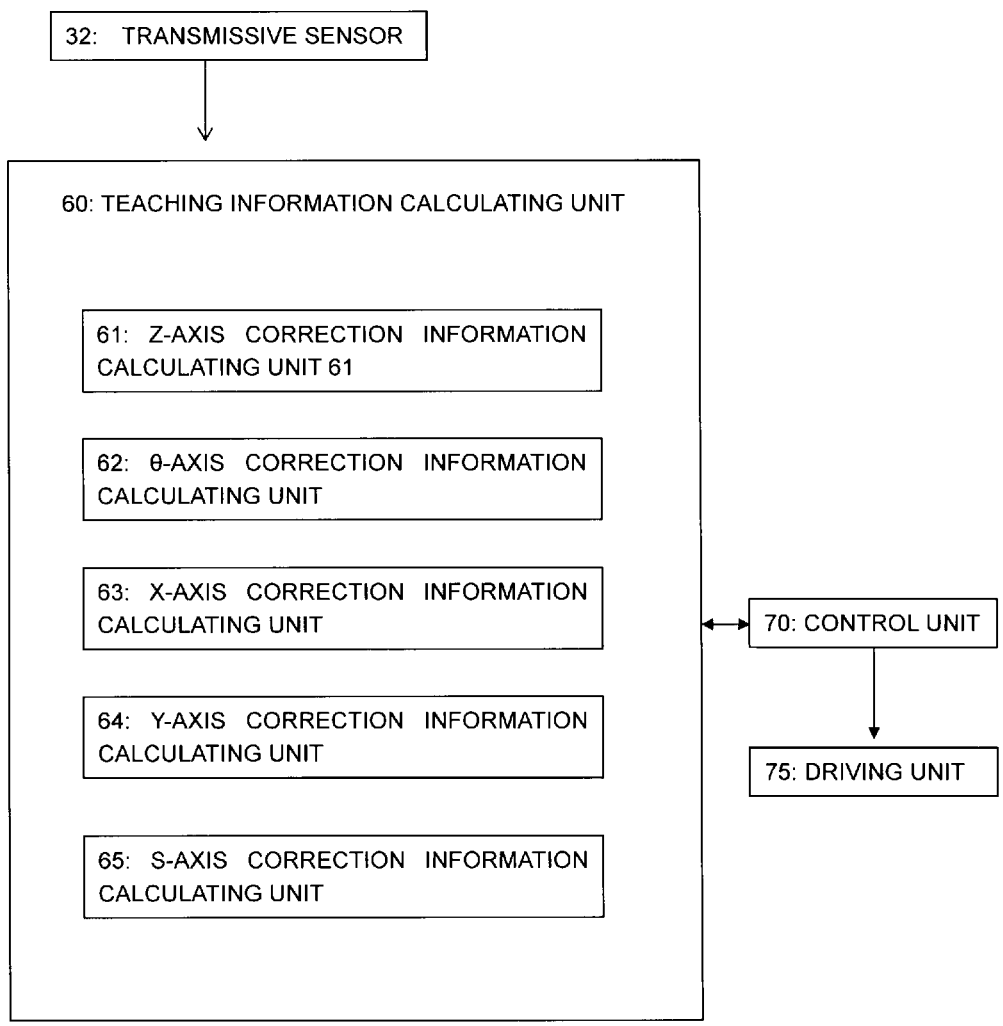
FIG. 6 is a block diagram illustrating an example of an auto-teaching control mechanism of a wafer transport apparatus 10.

Next, an auto-teaching control mechanism of the wafer transport apparatus 10 will be described with reference to FIG. 6. FIG. 6 is a block diagram illustrating an example of the auto-teaching control mechanism of the wafer transport apparatus 10. The transmissive sensor 32 provided in the sensor jig 30 is connected to the teaching information calculating unit 60 through a control unit (not shown). The control unit of the transmissive sensor 32 supplies power to the amplifier 33 shown in FIG. 3, receives an ON/OFF signal obtained by the transmission/light shielding of the transmissive sensor 32, which is converted by the amplifier 33, from the amplifier 33, and transmits the received signal to the teaching information calculating unit 60. That is, the control unit of the transmissive sensor 32 transmits signals between the teaching information calculating unit 60 and the transmissive sensor 32 and functions as an I/O terminal of a transmission system whose representative example is CC-Link (registered trademark) or UniWire (registered trademark).

Figure 24:
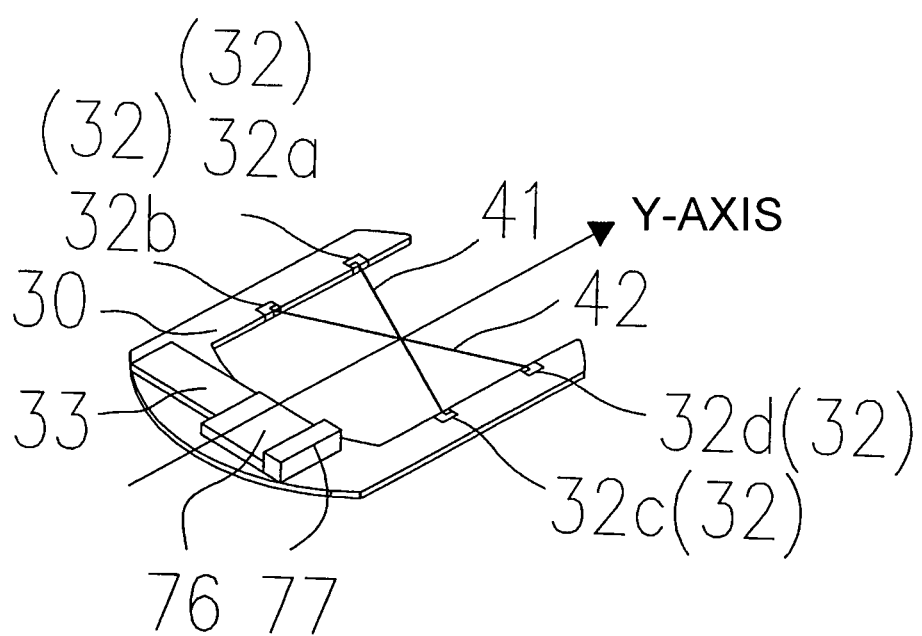
FIG. 24 is a diagram illustrating an example of still another sensor jig.

As another means for transmitting signals between the teaching information calculating unit 60 and the transmissive sensor 32, for example, the following structure may be used: a wireless signal transmitter 76 that converts the electric signal converted by the amplifier 33 into a wireless signal, such as a Bluetooth signal, and transmits the converted signal and a battery 77 that supplies power to the amplifier 33 and the wireless signal transmitter 76 are provided on the sensor jig 30, as shown in FIG. 24. In this case, a predetermined receiver is connected to the teaching information calculating unit 60 and the teaching information calculating unit 60 receives the signals transmitted from the wireless signal transmitter 76. According to this structure, the connector 34 shown in FIG. 3 and the control unit of the transmissive sensor 32 are not needed. As a result, it is not necessary to connect the connector 34 to the control unit of the transmissive sensor 32 connected to the teaching information calculating unit 60 before a position teaching operation starts. Therefore, it is possible to start the position teaching operation only by mounting the sensor jig 30 on the wafer transport portion 24.

As shown in FIG. 6, the teaching information calculating unit 60 transmits transport operation information for acquiring teaching information on the transport position to a control unit 70. The control unit 70 controls a driving unit 75 of the wafer transport apparatus 10 to move the wafer transport apparatus 10 and the sensor jig 30 on the wafer transport portion 24 on the basis of the received transport operation information.

The information calculating unit 60 calculates teaching information on the transport position on the basis of the light-shielding and transmission timing information of the optical axis 41 and the optical axis 42 by the light shielding jig 50 provided at the transport position, which is obtained from the transmissive sensor 32 by the movement operation of the sensor jig 30, and the driving information of the wafer transport apparatus 10 in the X-axis direction, the Y-axis direction, and the Z-axis direction when the light shielding and transmission timing information is acquired by the control unit 70. The control unit 70 controls the transport position of the semiconductor wafer on the basis of the teaching information calculated by the teaching information calculating unit 60. The teaching information calculating unit 60 calculates teaching information on the following correction.

(1) Correction of Movement of Wafer Transport Apparatus 10 Along Z-Axis (Z-Axis Correction)

A Z-axis correction information calculating unit 61 of the teaching information calculating unit 60 calculates teaching information on this correction. The center position of the upper end of the light shielding pin 51 in the Z direction is calculated from the driving information of the wafer transport apparatus 10 in the Z-axis direction at the light shielding start timing of the light shielding pin 51 for one of the optical axis 41 and the optical axis 42 when the transport robot 12 is moved in the −Z-axis direction. Then, teaching information for performing correction such that the position information of the transport position in the Z direction is identical to the position information of the wafer transport apparatus 10 in the Z-axis direction is calculated. However, the operation of the transport robot 12 and a method of calculating the teaching information will be described in detail below (see FIGS. 9 and 10).

(2) Correction of Movement of Wafer Transport Apparatus 10 Along θ-Axis (θ-Axis Correction)

A θ-axis correction information calculating unit 62 of the teaching information calculating unit 60 calculates teaching information on this correction. The angular deviation between the Y-axis direction and the Y direction of the wafer transport apparatus 10 is calculated from the driving information of the wafer transport apparatus 10 in the Y-axis direction at the light shielding start timing of the light shielding pin 51 for one of the optical axis 41 and the optical axis 42 when the transport robot 12 is moved in the +Y-axis direction and the driving information of the wafer transport apparatus 10 in the X-axis direction at the light shielding start timing of the light shielding pin 51 for one of the optical axis 41 and the optical axis 42 when the transport robot 12 is moved in the X-axis direction. That is, teaching information for performing correction such that the Y-axis direction and the Y direction of the wafer transport apparatus 10 are aligned with each other is calculated. Here, the rotation center axis of the wafer transport portion 24 is referred to as the θ-axis. However, the operation of the transport robot 12 and a method of calculating the teaching information will be described in detail below (see FIGS. 11, 12, and 13).

(3) Correction of Movement of Wafer Transport Apparatus 10 Along X-Axis (X-Axis Correction)

An X-axis correction information calculating unit 63 of the teaching information calculating unit 60 calculates teaching information on this correction. The amount of deviation between the position information of the transport position in the X direction and the position information of the wafer transport apparatus 10 in the X-axis direction is calculated from the driving information of the wafer transport apparatus 10 in the Y-axis direction at the light shielding start timing of the light shielding pin 51 for the optical axis 41 and the optical axis 42 when the transport robot 12 is moved in the +Y-axis direction. That is, teaching information for performing correction such that the position information of the transport position in the X direction is identical to the position information of the wafer transport apparatus 10 in the X-axis direction is calculated. However, the operation of the transport robot 12 and a method of calculating the teaching information will be described in detail below (see FIGS. 14, 15, 16, and 20).

(4) Correction of Movement of Wafer Transport Apparatus 10 Along Y-Axis (Y-Axis Correction)

A Y-axis correction information calculating unit 64 of the teaching information calculating unit 60 calculates teaching information on this correction. Teaching information for performing correction such that the position information of the transport position in the Y direction is identical to the position information of the wafer transport apparatus 10 in the Y-axis direction is calculated from the driving information of the wafer transport apparatus 10 in the Y-axis direction at the light shielding start timing of the light shielding pin 51 for the optical axis 41 and the optical axis 42 when the transport robot 12 is moved in the +Y-axis direction. However, the operation of the transport robot 12 and a method of calculating the teaching information will be described in detail below (see FIGS. 20 and 21).

(5) Correction of Light Shielding Jig 50 in Y Direction or X Direction (S-Axis Correction)

An S-axis correction information calculating unit 65 of the teaching information calculating unit 60 calculates teaching information on this correction. When the S-axis is aligned with the Y direction, the angular deviation between the S-axis of the light shielding jig 50 and the Y direction of the transport position in terms of the design is calculated from the driving information of the wafer transport apparatus 10 in the Y-axis direction at the light shielding start timing of the light shielding pin 52 for the optical axis 41 and the optical axis 42 when the transport robot 12 is moved from the center position of the light shielding pin 51 in the +Y-axis direction. That is, teaching information for performing correction such that the S-axis of the light shielding jig 50 is aligned with the Y direction of the transport position in terms of the design is calculated.

When the S-axis is aligned with the X direction, the angular deviation between the S-axis of the light shielding jig 50 and the X direction of the transport position in terms of the design is calculated from the driving information of the wafer transport apparatus 10 in the X-axis direction at the light shielding start timing of the light shielding pin 52 for the optical axis 41 and the optical axis 42 when the transport robot 12 is moved from the center position of the light shielding pin 51 in the +X-axis direction. That is, teaching information for performing correction such that the S-axis of the light shielding jig 50 is aligned with the X direction of the transport position in terms of the design is calculated.

When the S-axis is different from the Y direction and the X direction, the angular deviation between the Y direction in terms of installation, which is calculated from the S-axis of the light shielding jig 50, and the Y direction of the transport position in terms of the design is calculated from the driving information of the wafer transport apparatus 10 in the Y-axis direction at the light shielding start timing of the light shielding pin 52 for the optical axis 41 and the optical axis 42 when the transport robot 12 is moved from the center position of the light shielding pin 51 in the +Y-axis direction. That is, teaching information for performing correction such that the S-axis of the light shielding jig 50 is aligned with the Y direction of the transport position in terms of the design is calculated.

Figure 5:
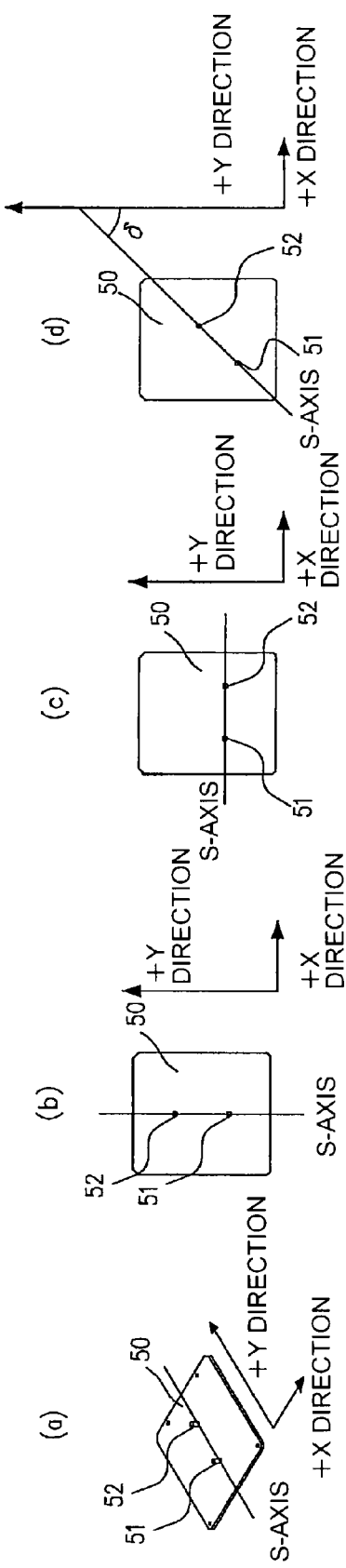
FIG. 5 is a diagram illustrating an example of a light shielding jig.

In this embodiment, as shown in FIG. 5, since the light shielding jig is provided such that the S-axis is aligned with the Y direction, teaching information for performing correction such that the S-axis of the light shielding jig 50 is aligned with the Y direction of the transport position in terms of the design is calculated. However, the operation of the transport robot 12 and a method of calculating the teaching information will be described in detail below (see FIGS. 17, 18, and 19).

Next, the outline of an auto-teaching process will be described with reference to FIG. 7 and the details of the auto-teaching process will be described with reference to FIGS. 9 to 21.

Figure 7:
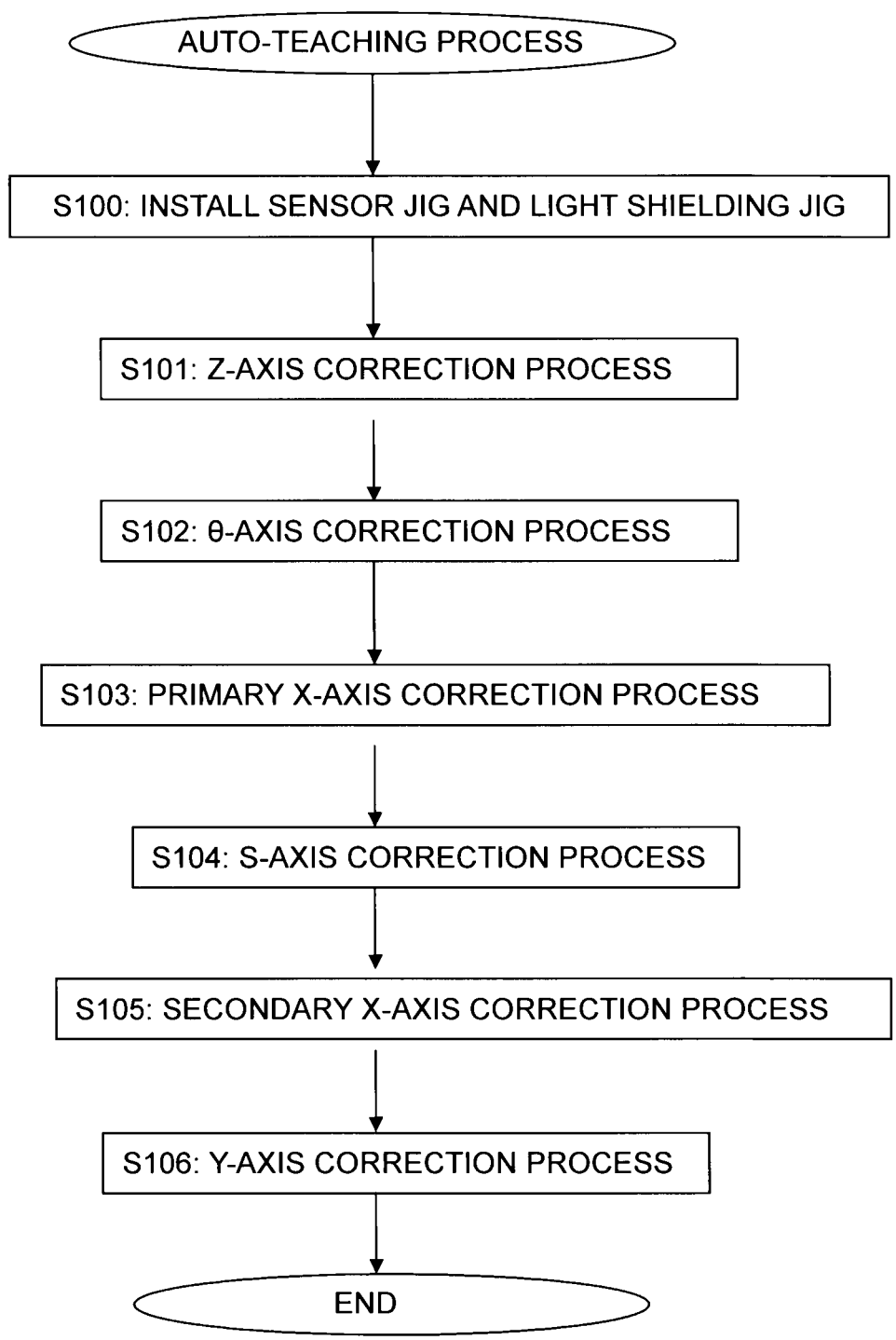
FIG. 7 is a flowchart illustrating an example of the outline of an auto-teaching process.

FIG. 7 is a flowchart illustrating an example of the outline of the auto-teaching process.

As shown in FIG. 7, first, the light shielding jig 50 is provided in the load port 11 and the sensor jig 30 is provided in the wafer transport portion 24 of the transport robot 12 (S100).

Then, the center position of the upper end of the light shielding pin 51 in the Z direction is calculated from the driving information of the wafer transport apparatus 10 in the Z-axis direction at the light shielding start timing of the light shielding pin 51 for one of the optical axis 41 and the optical axis 42 when the transport robot 12 is moved in the −Z-axis direction (S101).

Then, the angular deviation between the Y-axis direction and the Y direction of the wafer transport apparatus 10 is calculated from the driving information of the wafer transport apparatus 10 in the Y-axis direction at the light shielding start timing of the light shielding pin 51 for one of the optical axis 41 and the optical axis 42 when the transport robot 12 is moved in the +Y-axis direction and the driving information of the wafer transport apparatus 10 in the X-axis direction at the light shielding start timing of the light shielding pin 51 for one of the optical axis 41 and the optical axis 42 when the transport robot 12 is moved in the X-axis direction (S102). The calculated angular deviation is corrected such that the Y-axis direction and the Y direction of the wafer transport apparatus 10 are aligned with each other.

Then, the amount of deviation between the position information of the transport position in the X direction and the position information of the wafer transport apparatus 10 in the X-axis direction is calculated from the driving information of the wafer transport apparatus 10 in the Y-axis direction at the light shielding start timing of the light shielding pin 51 for the optical axis 41 and the optical axis 42 when the transport robot 12 is moved in the +Y-axis direction (S103). The calculated amount of deviation in the X-axis direction is corrected such that the position information of the transport position in the X direction is identical to the position information of the wafer transport apparatus 10 in the X-axis direction.

Then, the angular deviation between the S-axis of the light shielding jig 50 and the Y direction of the transport position in terms of the design is calculated from the driving information of the wafer transport apparatus 10 in the Y-axis direction at the light shielding start timing of the light shielding pin 52 for the optical axis 41 and the optical axis 42 when the transport robot 12 is moved from the center position of the light shielding pin 51 in the +Y-axis direction (S104). The calculated angular deviation is corrected such that the S-axis of the light shielding jig 50 is aligned with the Y direction of the transport position in terms of the design.

However, as shown in FIG. 5, since the light shielding jig is provided such that the S-axis is aligned with the Y direction, teaching information for performing correction such that the S-axis of the light shielding jig 50 is aligned with the Y direction of the transport position in terms of the design is calculated. However, when the light shielding jig is provided such that the S-axis is aligned with the X direction, the angular deviation between the S-axis of the light shielding jig 50 and the X direction of the transport position in terms of the design is calculated from the driving information of the wafer transport apparatus 10 in the X-axis direction at the light shielding start timing of the light shielding pin 52 for the optical axis 41 and the optical axis 42 when the transport robot 12 is moved from the center position of the light shielding pin 51 in the +X-axis direction. When the S-axis is different from the Y direction and the X direction, the angular deviation between the Y direction in terms of installation, which is calculated from the S-axis of the light shielding jig 50, and the Y direction of the transport position in terms of the design is calculated from the driving information of the wafer transport apparatus 10 in the Y-axis direction at the light shielding start timing of the light shielding pin 52 for the optical axis 41 and the optical axis 42 when the transport robot 12 is moved from the center position of the light shielding pin 51 in the +Y-axis direction.

Then, the amount of deviation between the position information of the transport position in the X direction, which is obtained by the correction in Step S104, and the position information of the wafer transport apparatus 10 in the X-axis direction is calculated by the same method as that in Step S103 from the driving information of the wafer transport apparatus 10 in the Y-axis direction at the light shielding start timing of the light shielding pin 51 for the optical axis 41 and the optical axis 42 when the transport robot 12 is moved in the +Y-axis direction (S105). The calculated amount of deviation in the X-axis direction is corrected such that the position information of the transport position in the X direction is identical to the position information of the wafer transport apparatus 10 in the X-axis direction.

Finally, teaching information for performing correction such that the position information of the transport position in the Y direction is identical to the position information of the wafer transport apparatus 10 in the Y-axis direction is calculated from the driving information of the wafer transport apparatus 10 in the Y-axis direction at the light shielding start timing of the light shielding pin 51 for the optical axis 41 and the optical axis 42 when the transport robot 12 is moved in the +Y-axis direction (S106).

Figure 9:
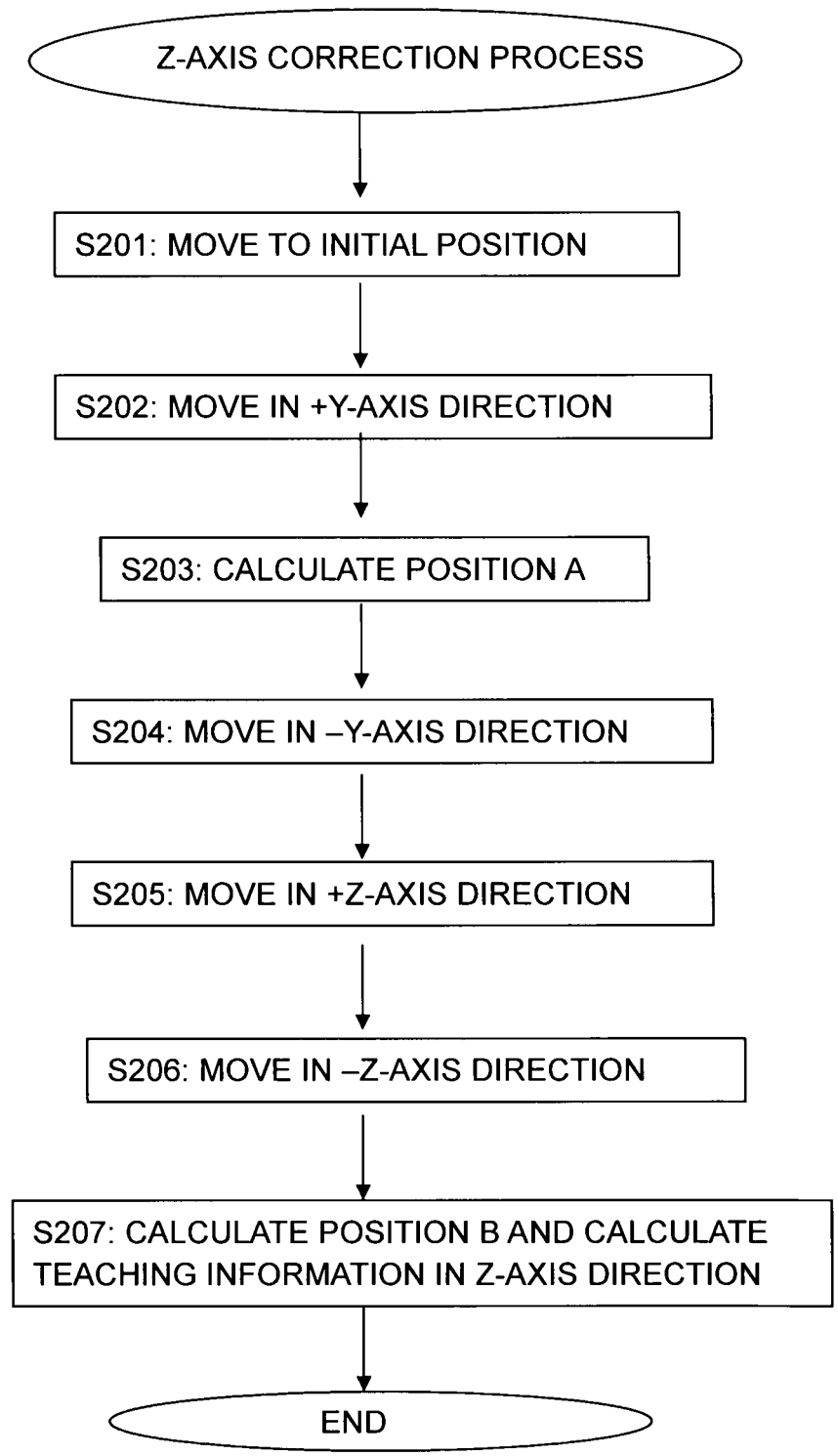
FIG. 9 is a flowchart illustrating an example of a Z-axis correction process (S101).
Figure 10:
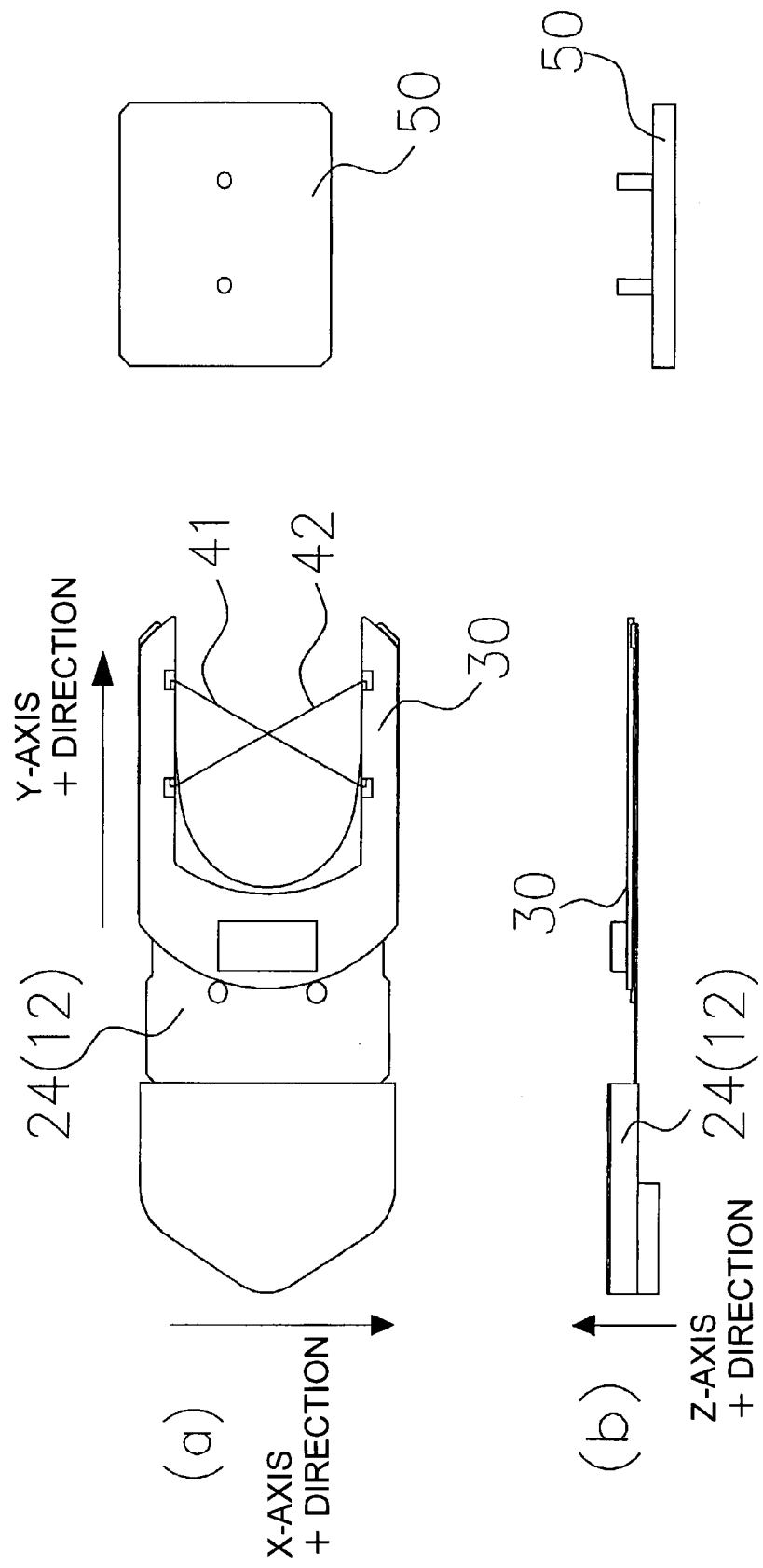
FIG. 10 is a diagram illustrating an example of the initial position of the transport robot 12.

Next, the details of the Z-axis correction process (S101) shown in FIG. 7 will be described with reference to FIGS. 9 and 10. FIG. 9 is a flowchart illustrating an example of the Z-axis correction process (S101). FIG. 10 is a diagram illustrating an example of the initial position of the transport robot 12. Specifically, FIG. 10(a) is a schematic top view and FIG. 10(b) is a schematic side view.

As shown in FIG. 9, first, the transport robot 12 is moved to a predetermined initial position (S201). As shown in FIG. 10, the initial position in the X-axis direction and the Z-axis direction is a position where it is expected that the optical axis 41 and the optical axis 42 will be shielded by the light shielding pin 51 when the transport robot 12 is moved in the +Y-axis direction. In addition, the initial position is a position where the light shielding jig 50 or a peripheral member other than the light shielding pin 51 does not contact the transport robot 12 and the sensor jig 30.

Then, the transport robot 12 is moved from the initial position in the +Y-axis direction until the optical axis 41 passes through the light shielding pin 51 (S202).

Then, the center position (position A) of the light shielding pin 51 in the Y-axis direction is calculated on the basis of the driving information of the wafer transport apparatus 10 in the Y-axis direction at the light shielding start timing of the light shielding pin 51 for the optical axis 41 during the movement in Step S202 and the shape size of the light shielding pin 51 (S203).

Then, the transport robot 12 is moved in the −Y-axis direction such that the optical axis 41 passes through the position A (S204). Then, the transport robot 12 is moved in the +Z-axis direction such that the optical axis 41 is in a light transmission state (S205).

Then, the transport robot 12 is moved a distance corresponding to the movement distance in the +Z-axis direction in Step S205 in the −Z-axis direction (S206). Then, the position (position B) of the upper end of the light shielding pin 51 in the Z-axis direction is calculated on the basis of the driving information of the wafer transport apparatus 10 in the Z-axis direction at the light shielding start timing of the light shielding pin 51 for the optical axis 41 and the shape size of the light shielding pin 51, and teaching information for performing correction such that the position information of the transport position in the Z direction is identical to the position information of the wafer transport apparatus 10 in the Z-axis direction is calculated (S207).

Figure 11:
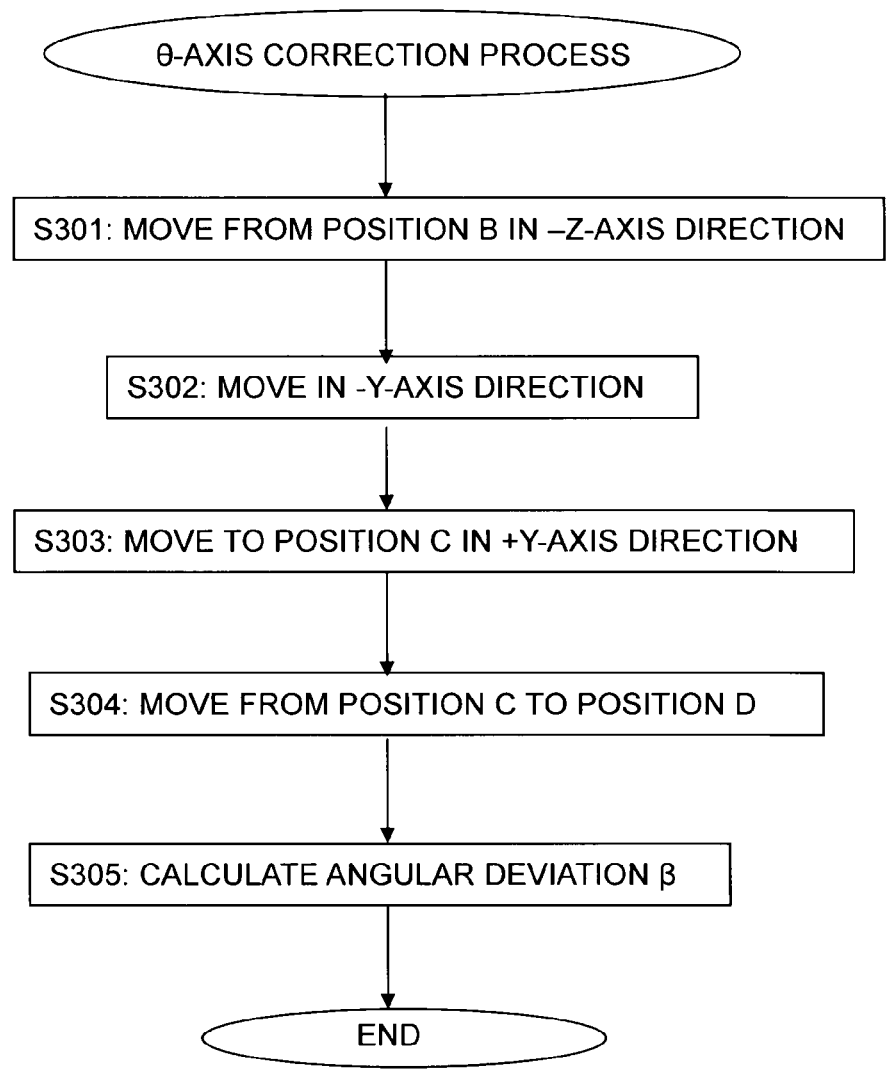
FIG. 11 is a flowchart illustrating an example of a θ-axis correction process (S102).
Figure 12:
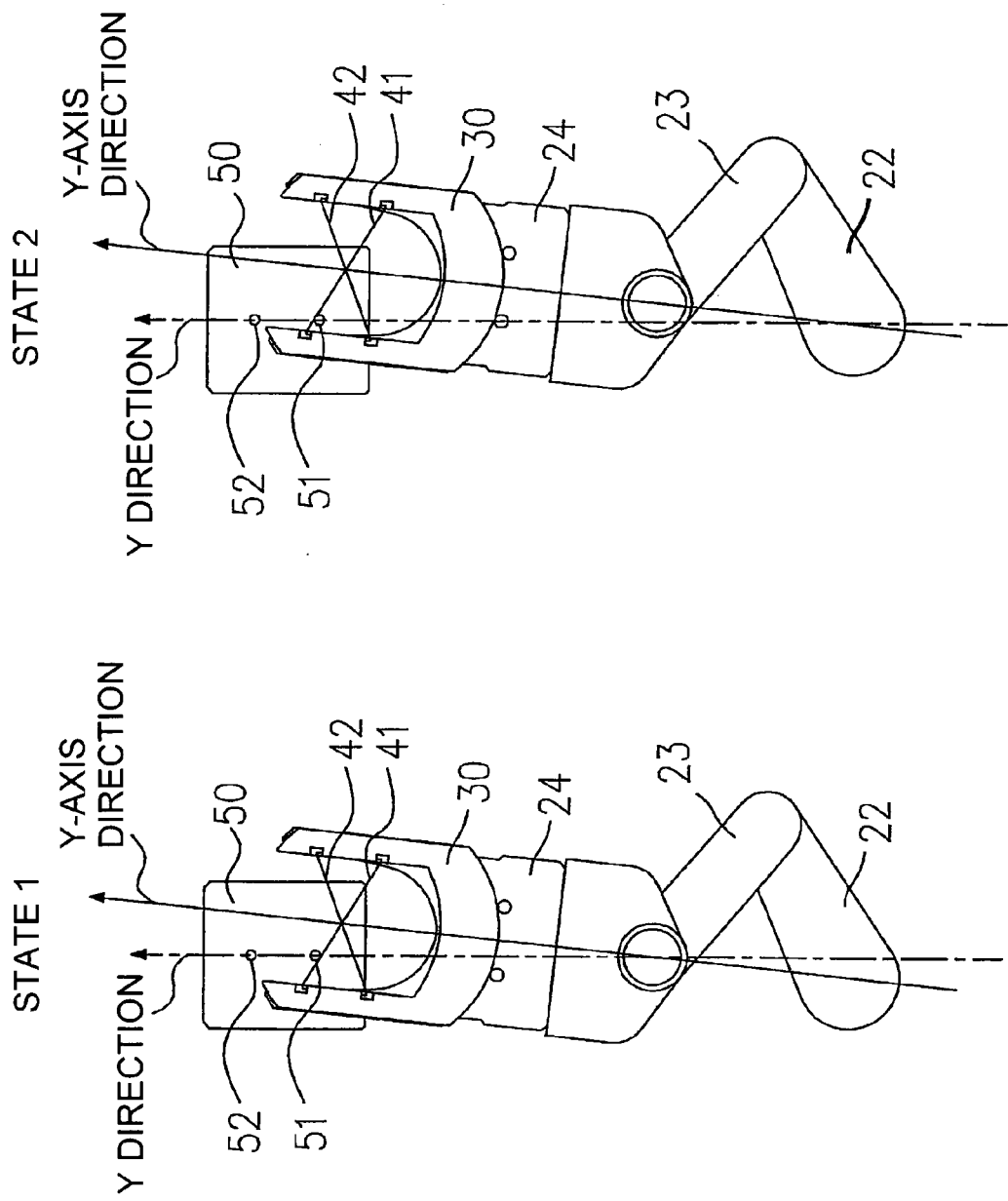
FIG. 12 is a diagram illustrating an example of the operation of the transport robot 12.
Figure 13:
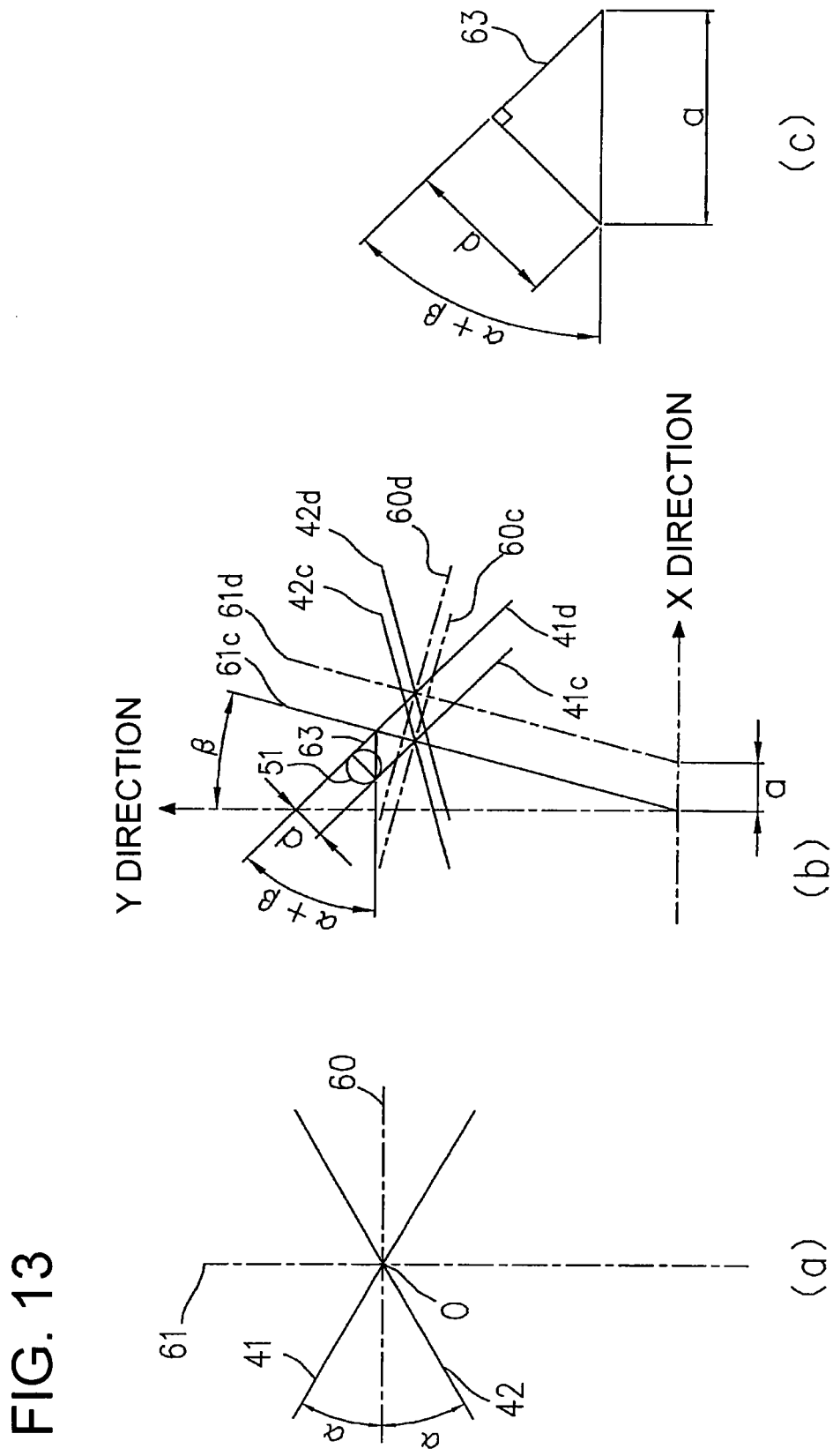
FIG. 13 is a diagram illustrating a method of calculating θ-axis correction teaching information.

Next, the details of the θ-axis correction process (S102) shown in FIG. 7 will be described with reference to FIGS. 11 to 13. FIG. 11 is a flowchart illustrating an example of the θ-axis correction process (S102). FIG. 12 is a diagram illustrating an example of the operation of the transport robot 12. FIG. 13 is a diagram illustrating a method of calculating θ-axis correction teaching information.

As shown in FIG. 11, first, the transport robot 12 is moved in the −Z-axis direction from the position B to the position in the Z-axis direction where the light shielding pin 51 can shield the optical axis 41, which is calculated on the basis of the position B in Step S207 of FIG. 9 (S301). In this case, it is checked whether the light shielding pin 51 shields the optical axis 41.

Then, the transport robot 12 is moved in the −Y-axis direction to a position where light is transmitted along the optical axis 41 (S302). Then, the transport robot 12 is moved in the +Y-axis direction to a position (position C) where the light shielding pin 51 starts to shield the optical axis 41 (S303). That is, the transport robot 12 is moved in the +Y-axis direction to the position C which is represented by (state 1) in FIG. 12.

Then, the transport robot 12 is moved in the +X-axis direction from the position C to a position (position D) where light transmission along the optical axis 41 starts (S304). That is, the transport robot 12 is moved in the +Y-axis direction to a position D which is represented by (state 2) in FIG. 12.

Then, the angular deviation β between the Y-axis direction of the wafer transport apparatus 10 and the Y direction of the wafer transport apparatus 10 in terms of the design is calculated from the position C and the position D (S305).

Next, a method of calculating the angular deviation β will be described. As shown in FIG. 13(a), a segment that is vertical to the Y-axis direction of the wafer transport apparatus 10 and passes through an intersection point O between the optical axis 41 and the optical axis 42, that is, a segment in the X-axis direction is referred to as a segment 60 and a segment passing through the intersection point O in the Y-axis direction is referred to as a segment 61. The angle between each of the optical axis 41 and the optical axis 42 and the segment 60 is referred to as an optical axis angle α.

As shown in FIG. 13(b), the optical axis 41 at the position C is referred to as an optical axis 41c and the optical axis 41 at the position D is referred to as an optical axis 41d. The optical axis 42 at the position C is referred to as an optical axis 42c and the optical axis 42 at the position D is referred to as an optical axis 42d. The segment 60 at the position C is referred to as a segment 60c and the segment 60 at the position D is referred to as a segment 60d. The segment 61 at the position C is referred to as a segment 61c and the segment 61 at the position D is referred to as a segment 61d. The angular deviation between the Y-axis direction and the Y direction of the wafer transport apparatus 10 is represented by β.

As shown in FIGS. 13(b) and 13(c), a triangle 63 formed when the wafer transport apparatus 10 is moved from the position C to the position D satisfies the following Relational expression (1).

$$\sin(\alpha+\beta)=d/a \quad \text{[Relational expression (1)]}$$

(where "a" indicates the amount of movement from the position C to the position D in the X-axis direction and "d" indicates the diameter of the light shielding pin 51).

From Relational expression (1), the angular deviation β is represented by the following Relational expression (2).

$$\beta=\sin^{-1}(d/a)-\alpha. \quad \text{[Relational expression (2)]}$$

Relational expression (2) is used to calculate the angular deviation β between the Y-axis direction and the Y direction of the wafer transport apparatus 10 in Step S305.

Figure 14:
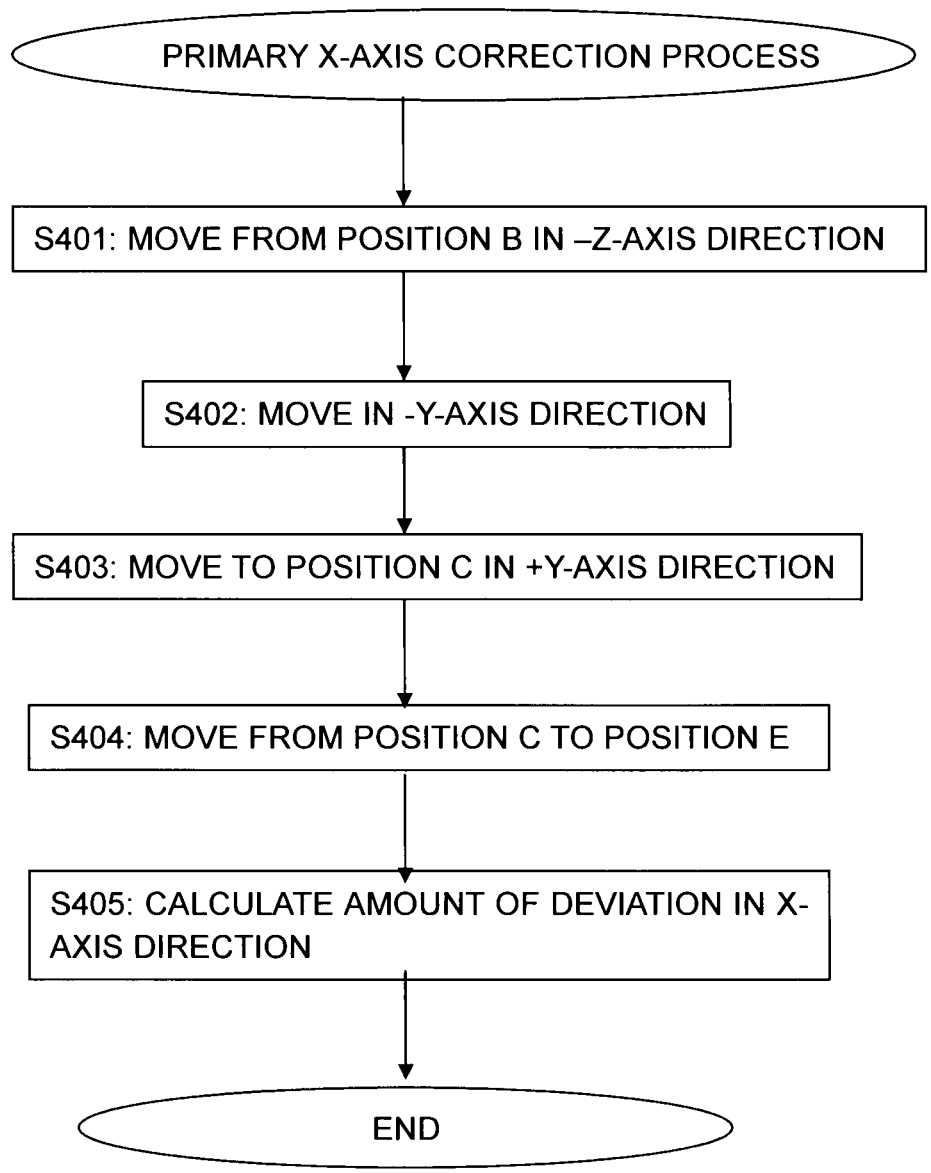
FIG. 14 is a flowchart illustrating an example of an X-axis correction process (S103).
Figure 15:
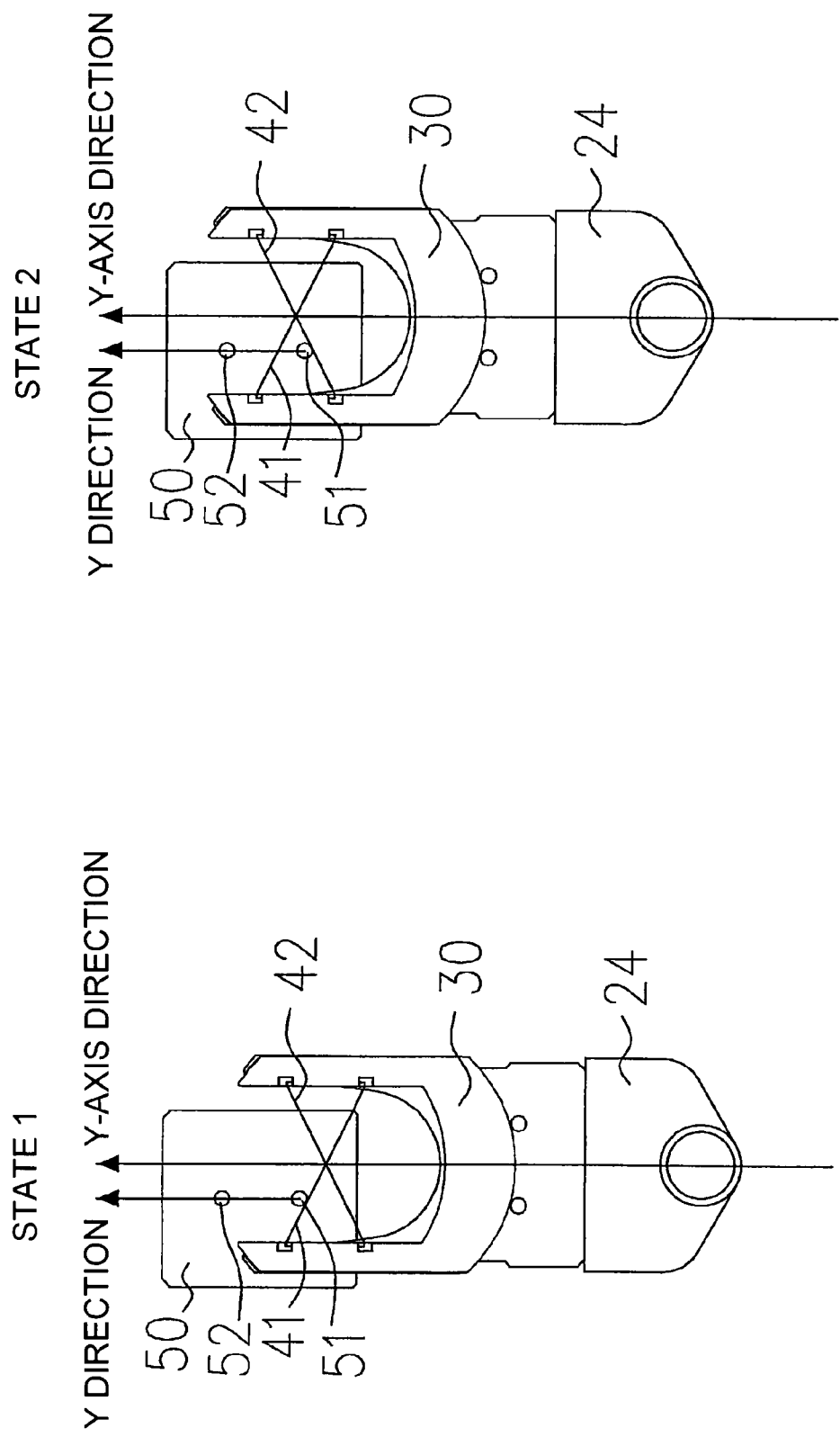
FIG. 15 is a diagram illustrating an example of the operation of the transport robot 12.
Figure 16:
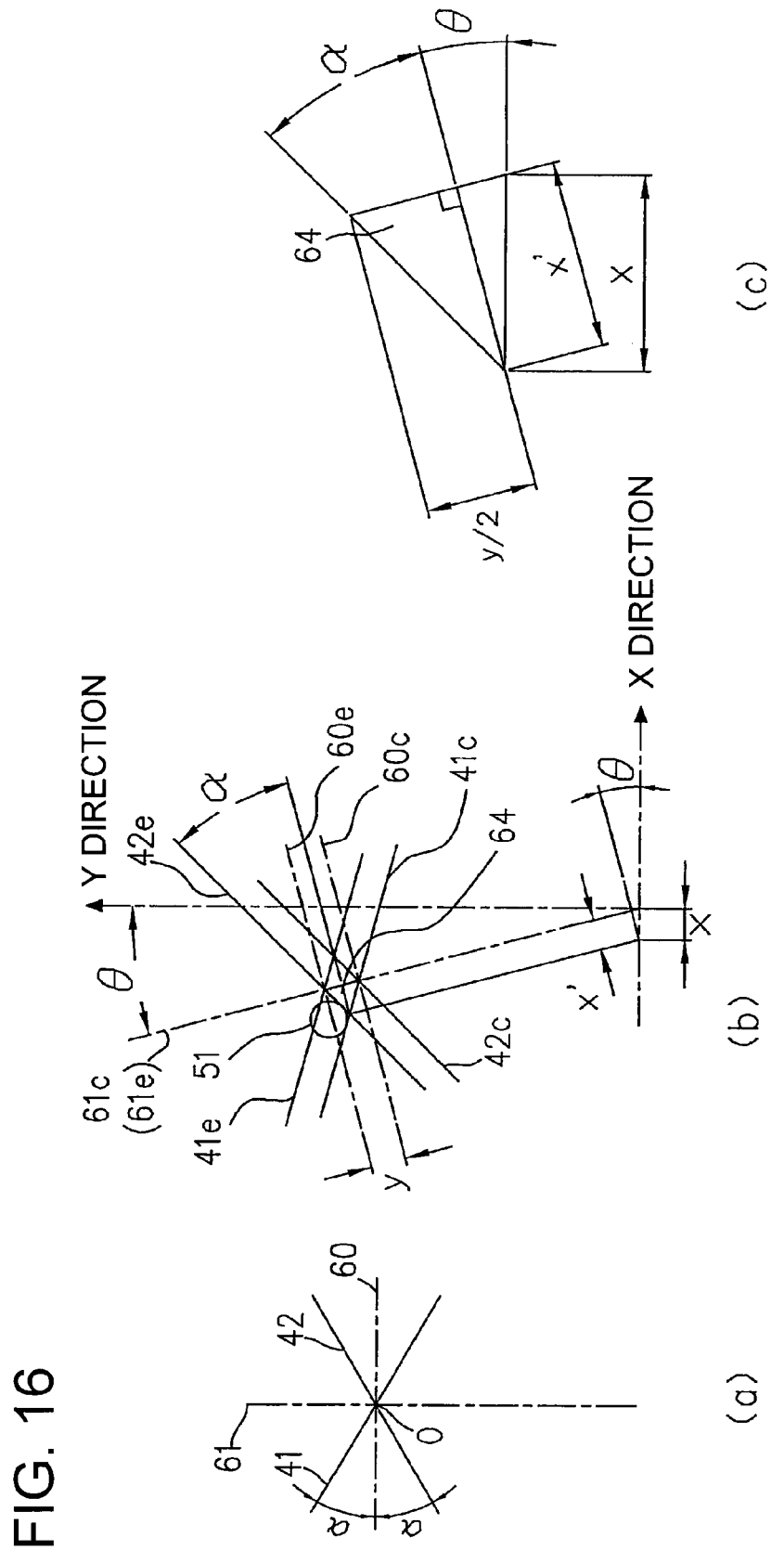
FIG. 16 is a diagram illustrating a method of calculating X-axis correction teaching information.

Next, the details of the primary X-axis correction process (S103) shown in FIG. 7 will be described with reference to FIGS. 14 to 16. FIG. 14 is a flowchart illustrating an example of the primary X-axis correction process (S103). FIG. 15 is a diagram illustrating an example of the operation of the transport robot 12. FIG. 16 is a diagram illustrating a method of calculating X-axis correction teaching information.

As shown in FIG. 14, first, the transport robot 12 that is corrected on the basis of the result of the θ-axis correction process up to the position in the Z-axis direction where the light shielding pin 51 can shield the optical axis 41, which is calculated on the basis of the position B in Step S207 of FIG. 9, is moved from the position B in the −Z-axis direction (S401). In this case, it is checked whether the light shielding pin 51 shields the optical axis 41.

Then, the transport robot 12 is moved in the −Y-axis direction to a position where light is transmitted along the optical axis 41 (S402). Then, the transport robot 12 is moved in the +Y-axis direction to the position (position C) where the light shielding pin 51 starts to shield the optical axis 41 (S403). That is, the transport robot 12 is moved in the +Y-axis direction to the position C which is represented by (state 1) in FIG. 15.

Then, the transport robot 12 is moved in the +Y-axis direction from the position C to a position (position E) where the light shielding pin 51 starts to shield the optical axis 42 (S404). That is, the transport robot 12 is moved in the +Y-axis direction to the position E which is represented by (state 2) in FIG. 15.

Then, the amount of deviation x between the position information of the transport position in the X direction and the position information of the wafer transport apparatus 10 in the X-axis direction is calculated from the position C and the position E (S405).

Next, a method of calculating the amount of deviation x in the X direction will be described. As shown in FIG. 16(a), a segment that is vertical to the Y-axis direction of the wafer transport apparatus 10 and passes through the intersection point O between the optical axis 41 and the optical axis 42, that is, a segment in the X-axis direction is referred to as the segment 60 and a segment passing through the intersection point O in the Y-axis direction is referred to as the segment 61. The angle between each of the optical axis 41 and the optical axis 42 and the segment 60 is referred to as the optical axis angle α.

As shown in FIG. 16(b), the optical axis 41 at the position C is referred to as the optical axis 41c and the optical axis 41 at the position E is referred to as an optical axis 41e. The optical axis 42 at the position C is referred to as the optical axis 42c and the optical axis 42 at the position E is referred to as an optical axis 42e. The segment 60 at the position C is referred to as the segment 60c and the segment 60 at the position E is referred to as a segment 60e. The segment 61 at the position C is referred to as the segment 61c and the segment 61 at the position E is referred to as a segment 61e. Here, the segment 61c and the segment 61e are aligned with each other. The angle between the Y-axis direction of the wafer transport apparatus 10 and the Y direction of the transport position in terms of the design is represented by θ. In this embodiment, θ is 0. In addition, the amount of deviation between the position information of the transport position in the X direction and the position information of the wafer transport apparatus 10 in the X-axis direction is represented by x.

As shown in FIGS. 16(b) and 16(c), a triangle 64 formed when the wafer transport apparatus 10 is moved from the position C to the position E satisfies the following Relational expressions (3) and (4).

$$\tan \alpha = (y/2)/x', \text{ and} \quad \text{[Relational expression (3)]}$$

$$\cos \theta = x'/x \quad \text{[Relational expression (4)]}$$

(where "y" indicates the amount of movement from the position C to the position E in the Y-axis direction).

From Relational expressions (3) and (4), the amount of deviation x is represented by the following Relational expression (5).

$$z = y/(2 \tan \alpha \cdot \cos \theta). \quad \text{[Relational expression (5)]}$$

Relational expression (5) is used to calculate the amount of deviation x between the position information of the transport position in the X direction and the position information of the wafer transport apparatus 10 in the X-axis direction in Step S405. However, in this embodiment, since θ is 0, the following Relational expression (5') is used to calculate the amount of deviation x between the position information of the transport position in the X direction and the position information of the wafer transport apparatus 10 in the X-axis direction in Step S405.

$$x = y/(2 \tan \alpha). \quad \text{[Relational expression (5')]}$$

Figure 17:
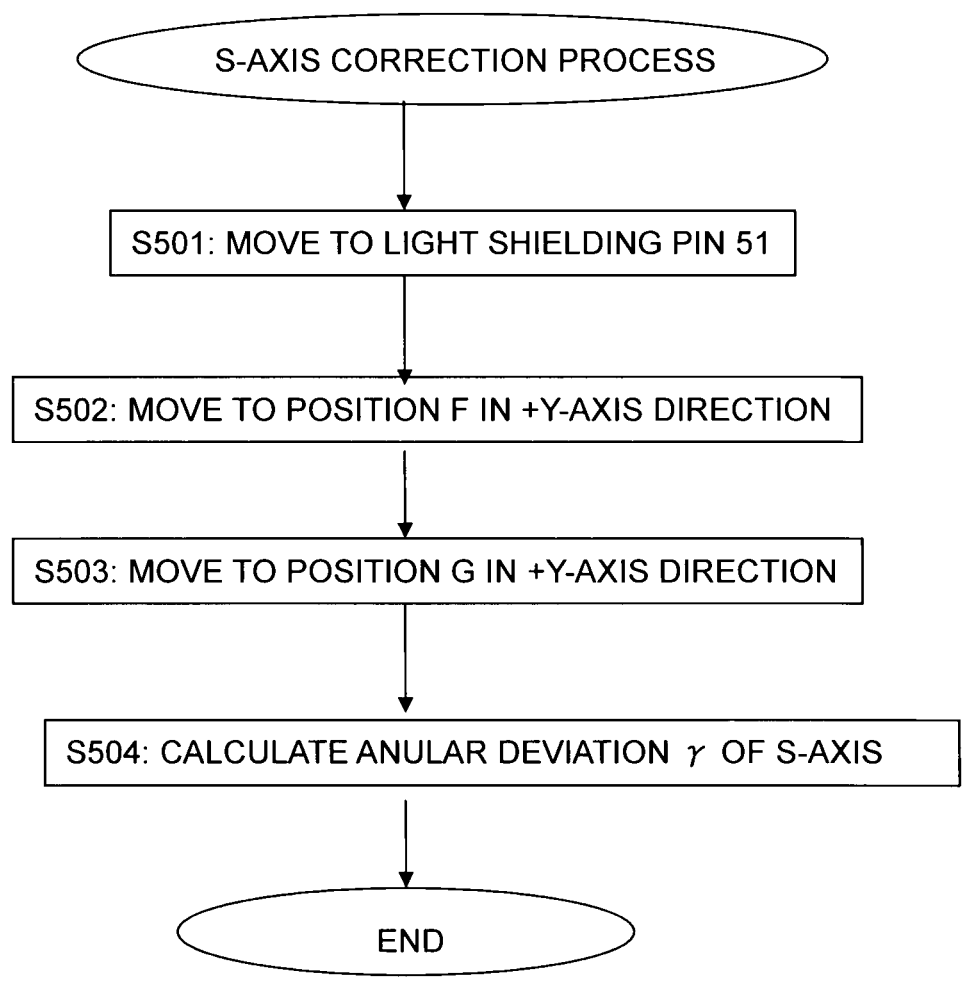
FIG. 17 is a flowchart illustrating an example of an S-axis correction process (S104).
Figure 18:
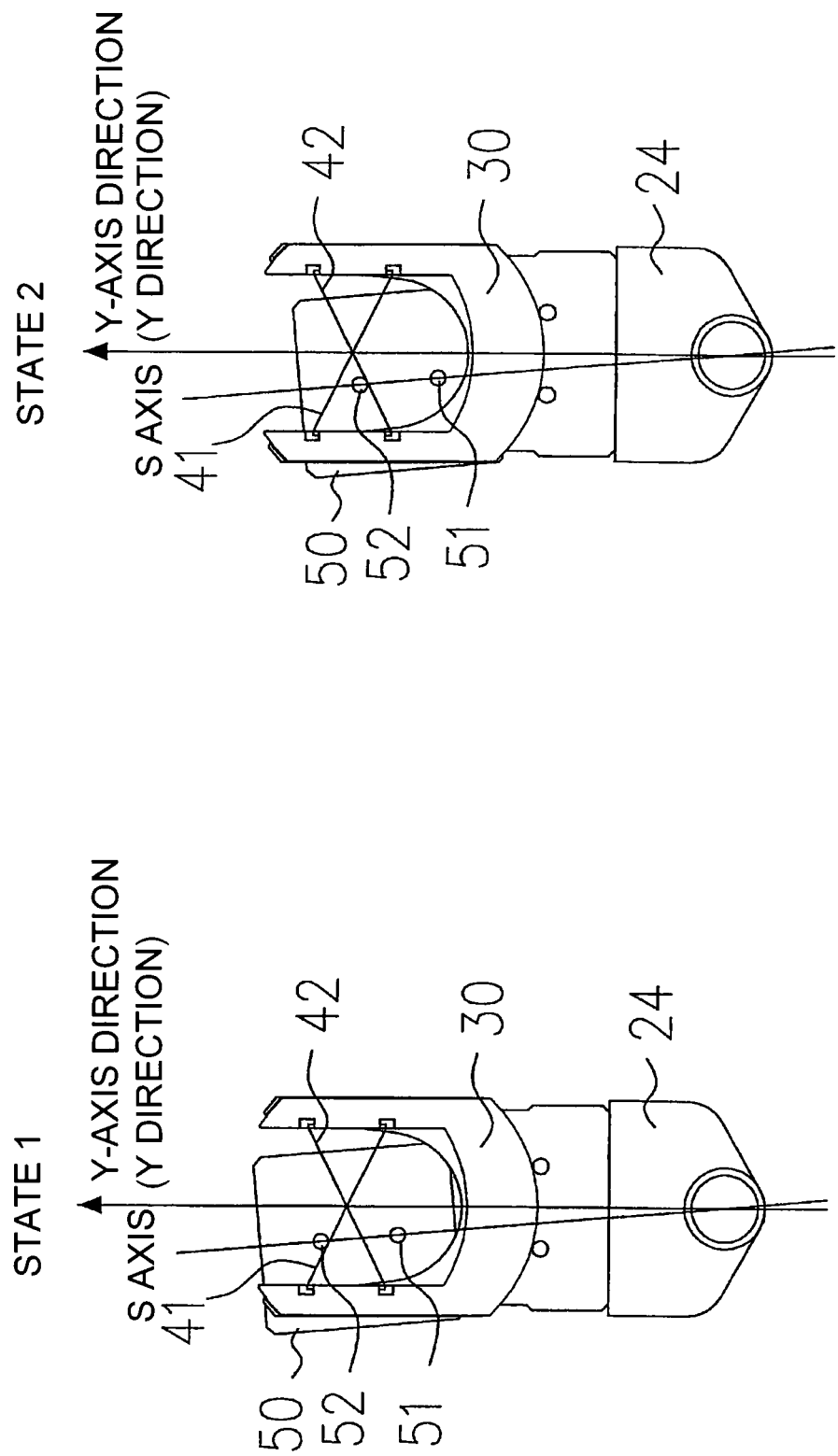
FIG. 18 is a diagram illustrating an example of the operation of the transport robot 12.
Figure 19:
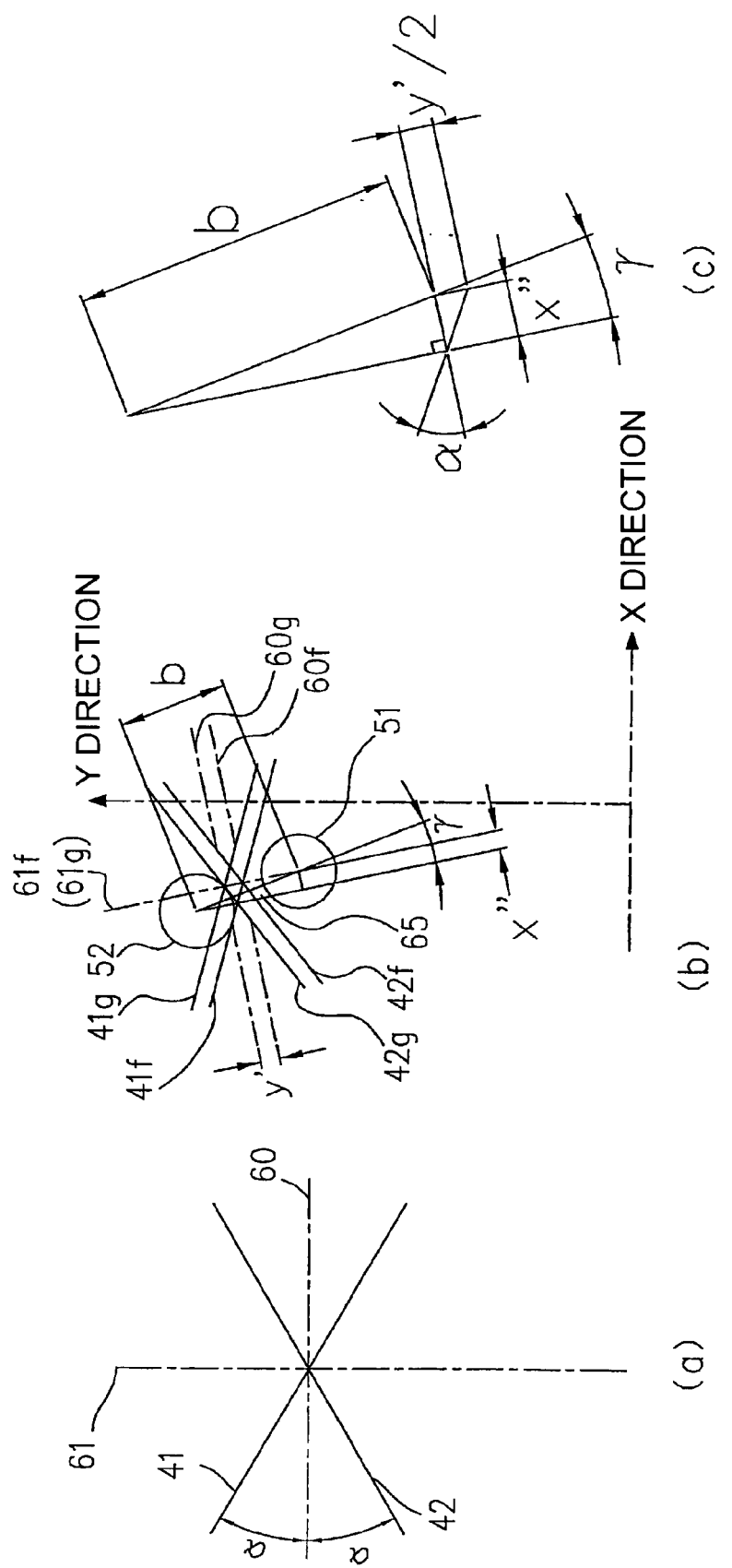
FIG. 19 is a diagram illustrating a method of calculating S-axis correction teaching information.

Next, the details of the S-axis correction process (S104) shown in FIG. 7 will be described with reference to FIGS. 17 to 19. FIG. 17 is a flowchart illustrating an example of the S-axis correction process (S104). FIG. 18 is a diagram illustrating an example of the operation of the transport robot 12. FIG. 19 is a diagram illustrating a method of calculating S-axis correction teaching information.

As shown in FIG. 17, first, the transport robot 12 corrected on the basis of the results of the θ-axis correction process and the primary X-axis correction process is moved such that the intersection point O between the optical axis 41 and the optical axis 42 is disposed at the center position of the light shielding pin 51 (S501).

Then, the transport robot 12 is moved in the +Y-axis direction to a position (position F) where the light shielding pin 52 starts to shield the optical axis 41 (S502). That is, the transport robot 12 is moved in the +Y-axis direction to the position F represented by (state 1) in FIG. 18.

Then, the transport robot 12 is moved in the +Y-axis direction from the position F to a position (position G) where the light shielding pin 52 starts to shield the optical axis 42 (S503). That is, the transport robot 12 is moved in the +Y-axis direction to the position G which is represented by (state 2) in FIG. 18.

Then, the angular deviation γ between the Y direction (S-axis) of the light shielding jig 50 in terms of installation and the Y direction of the transport position in terms of the design is calculated from the position F and the position G (S504).

Next, a method of calculating the angular deviation γ will be described. As shown in FIG. 19(a), a segment that is vertical to the Y-axis direction of the wafer transport apparatus 10 and passes through the intersection point O between the optical axis 41 and the optical axis 42, that is, a segment in the X-axis direction is referred to as the segment 60 and a segment passing through the intersection point O in the Y-axis direction is referred to as the segment 61. The angle between each of the optical axis 41 and the optical axis 42 and the segment 60 is referred to as the optical axis angle α.

As shown in FIG. 19(b), the optical axis 41 at the position F is referred to as an optical axis 41f and the optical axis 41 at the position G is referred to as an optical axis 41g. The optical axis 42 at the position F is referred to as an optical axis 42f and the optical axis 42 at the position G is referred to as an optical axis 42g. The segment 60 at the position F is referred to as a segment 60f and the segment 60 at the position G is referred to as a segment 60g. The segment 61 at the position F is referred to as a segment 61f and the segment 61 at the position G is referred to as a segment 61g. Here, the segment 61f and the segment 61g are aligned with each other. The angle between the Y-axis direction of the wafer transport apparatus 10 and the Y direction of the transport position in terms of the design is represented by θ. In this embodiment, θ is 0. The angular deviation between the Y direction (S-axis) of the light shielding jig 50 in terms of installation and the Y direction of the transport position in terms of the design is represented by γ.

As shown in FIGS. 19(b) and 19(c), a triangle 65 formed when the wafer transport apparatus 10 is moved from the position F to the position G satisfies the following Relational expression (6).

$$\sin \gamma = x''/b \quad \text{[Relational expression (6)]}$$

(where "b" indicates the distance between the center of the light shielding pin 51 and the center of the light shielding pin 52).

From the Relational expression (5), x'' is represented by the following Relational expression (7).

$$x'' = y'/(2 \tan \alpha \cdot \cos \theta)$$

(where y' indicates the amount of movement from the position F to the position G in the Y-axis direction).

Therefore, from Relational expressions (6) and (7), the angular deviation γ is represented by the following Relational expression (8).

$$\gamma = \sin^{-1}\{y'/(2b \cdot \tan \alpha \cdot \cos \theta)\} \quad \text{[Relational expression (8)]}$$

Relational expression (8) is used to calculate the angular deviation γ between the Y direction (S-axis) of the light shielding jig 50 in terms of installation and the Y direction of the transport position in terms of the design in Step S504. In this embodiment, since θ is 0, the following Relational expression (8') is used to calculate the angular deviation γ between the Y direction (S-axis) of the light shielding jig 50 in terms of installation and the Y direction of the transport position in terms of the design in Step S504.

$$\gamma = \sin^{-1}\{y'/(2b \cdot \tan \alpha)\}. \quad \text{[Relational expression (8')]}$$

Figure 20:
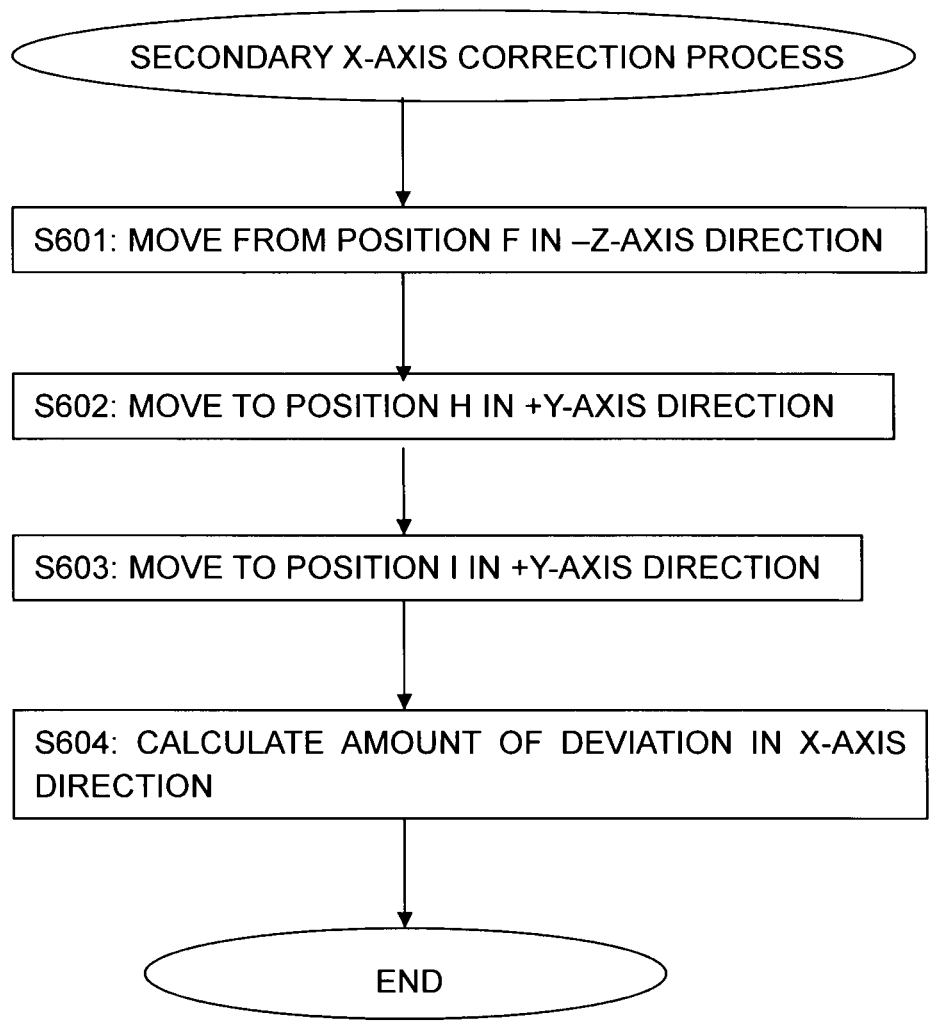
FIG. 20 is a flowchart illustrating an example of a secondary X-axis correction process (S105).

Next, the details of the secondary X-axis correction process (S105) shown in FIG. 7 will be described with reference to FIG. 20. FIG. 20 is a flowchart illustrating an example of the secondary X-axis correction process (S105). However, the secondary X-axis correction process (S105) is the same as the primary X-axis correction process (S103). In the primary X-axis correction process, the amount of deviation is calculated at the position where the light shielding pin 51 shields the optical axis 41 and the optical axis 42. However, in the secondary X-axis correction process, the amount of deviation is calculated at the position where the light shielding pin 52 shields the optical axis 41 and the optical axis 42.

As shown in FIG. 20, first, the transport robot 12 corrected on the basis of the results of the θ-axis correction process, the primary X-axis correction process, and the S-axis correction process is moved from the position F in Step S502 of FIG. 17 in the −Y-axis direction (S601). Then, the transport robot 12 is moved in the +Y-axis direction to a position (position H) where the light shielding pin 52 starts to shield the optical axis 41 (S602).

Then, the transport robot 12 is moved in the +Y-axis direction from the position H to a position (position I) where the light shielding pin 52 starts to shield the optical axis 42 (S603).

Then, the amount of deviation between the position information of the transport position in the X direction and the position information of the wafer transport apparatus 10 in the X-axis direction is calculated from the position H and the position I (S604).

Figure 21:
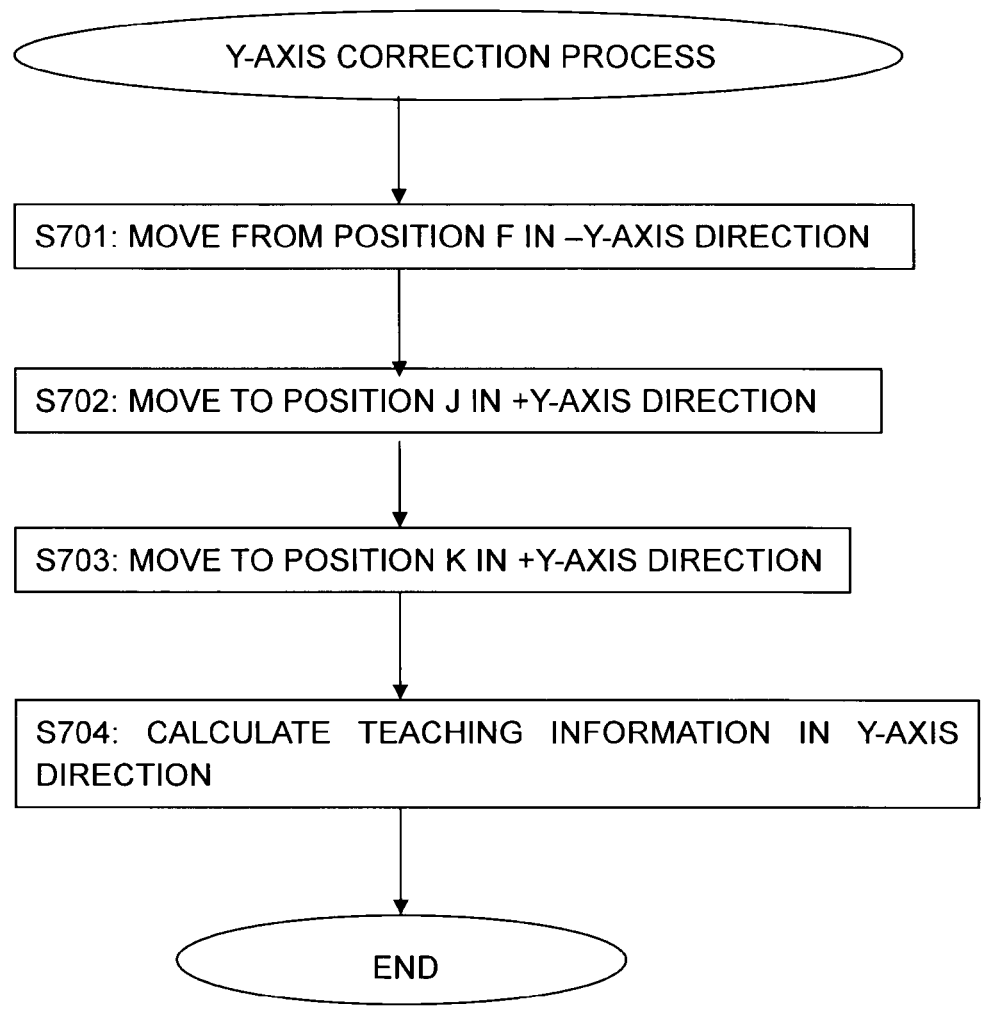
FIG. 21 is a flowchart illustrating an example of a Y-axis correction process (S106).
Figure 22:
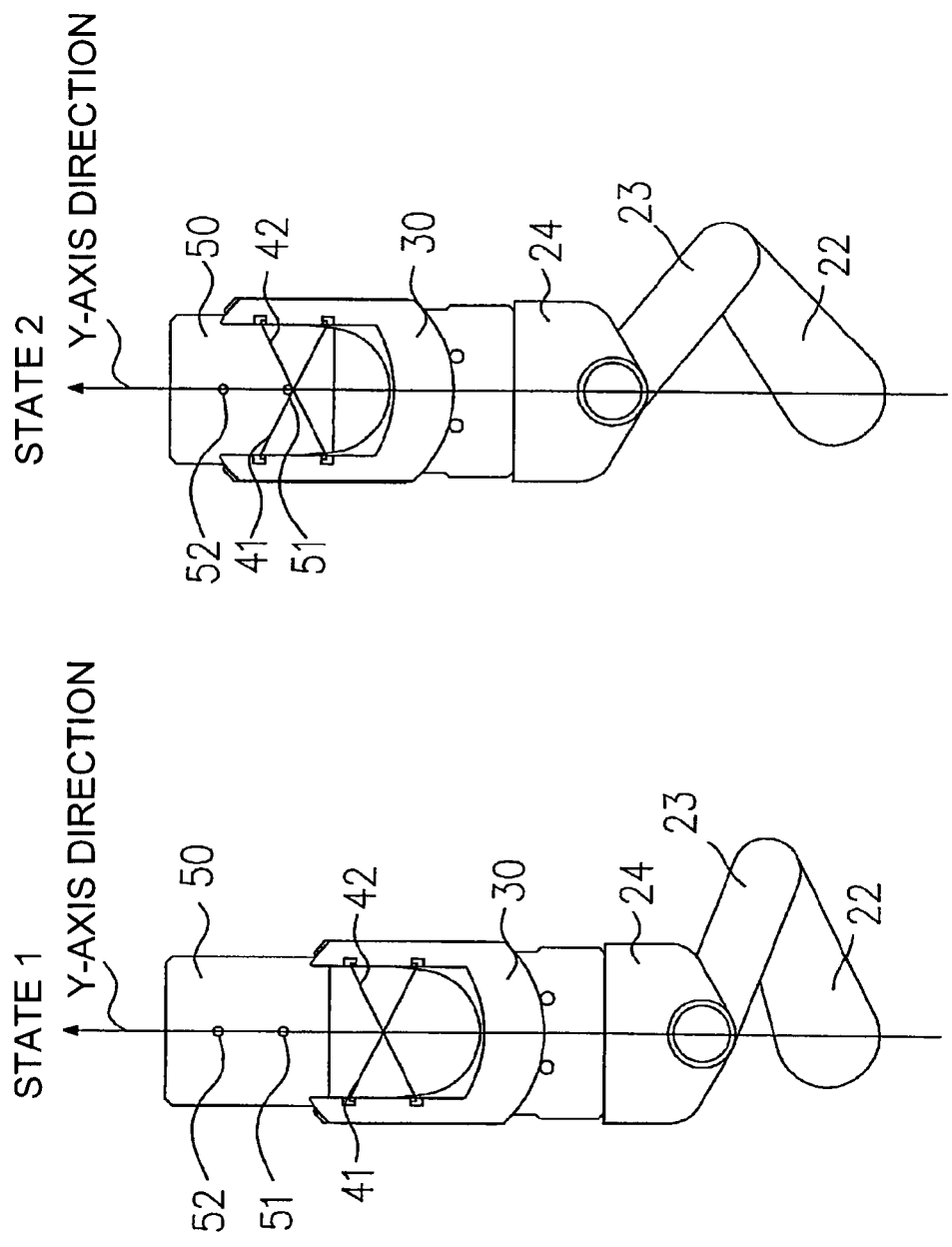
FIG. 22 is a diagram illustrating an example of the operation of the transport robot 12.

Next, the details of the Y-axis correction process (S106) shown in FIG. 7 will be described with reference to FIGS. 21 and 22. FIG. 21 is a flowchart illustrating an example of the Y-axis correction process (S106). FIG. 22 is a diagram illustrating an example of the operation of the transport robot 12.

As shown in FIG. 21, first, the transport robot 12 corrected on the basis of the results of the θ-axis correction process, the primary X-axis correction process, the S-axis correction process, and the secondary X-axis correction process is moved from the position F in Step S502 of FIG. 17 in the −Z-axis direction (S701). That is, the transport robot 12 is moved in the −Y-axis direction from the position F to a position which is represented by (state 1) in FIG. 22.

Then, the transport robot 12 is moved in the +Y-axis direction to a position (position J) where the light shielding pin 51 starts to shield the optical axis 41 starts (S702). That is, the transport robot 12 is moved in the +Y-axis direction to the position J which is represented by (state 2) in FIG. 22.

Then, the transport robot 12 is moved in the +Y-axis direction from the position J to a position (position K) where the light shielding pin 51 starts to shield the optical axis 42 (S703). Here, as shown in FIG. 3, in the sensor jig 30 provided in the transport robot 12, the projection segment of the optical axis 41 and the projection segment of the optical axis 42 on the projection plane are symmetric with respect to the Y-axis, and the transport robot 12 is corrected by the θ-axis correction process, the primary X-axis correction process, the S-axis correction process, and the secondary X-axis correction process. Therefore, the position J is substantially the same as the position K and the difference between the position J and the position K serves as an error.

Then, in order to consider the error of the transmissive sensor 32 due to the position J and the position K, the intermediate position between the position J and the position K is calculated as a Y-axis direction position, and teaching information for performing correction such that the position information of the transport position in the Y direction is identical to the position information of the wafer transport apparatus 10 in the Y-axis direction is calculated (S704).

It is possible to acquire transport position teaching information by providing the sensor jig 30 in the wafer transport apparatus 10, providing the light shielding jig 50 at the transport position, and performing a general transport operation, that is, without performing an avoiding operation for a teaching operation. Therefore, it is possible to calculate teaching information without considering the backlash of each axis of the wafer transport apparatus 10. That is, it is possible to easily calculate the teaching information and reduce the calculation time.

In the wafer transport apparatus 10 and the position teaching method, the angular deviation γ between the S-axis and the Y direction of the light shielding jig 50 provided at the transport position is considered. However, when the angular deviation γ caused by the provided light shielding jig 50 is small, the S-axis correction information calculating unit 65 may not be provided and the S-axis correction process S104 may not be performed. In this case, one light shielding pin may be provided on the light shielding jig 50.

In the wafer transport apparatus 10 and the position teaching method, the sensor jig 30 is provided in the wafer transport apparatus 10 and the light shielding jig 50 is provided at the transport position. However, the light shielding jig 50 may be provided in the wafer transport apparatus 10 and the sensor jig 30 may be provided at the transport position.

The light emitting portions 32a and 32b and the light receiving portions 32c and 32d are provided in the sensor jig 30 such that the projection segment of the optical axis 41 and the projection segment of the optical axis 42 in the transmissive sensor 32 of the sensor jig 30 intersect each other on a straight line (Y-axis) in the Y direction on the projection plane passing through the central axis 26 of the wafer transport apparatus 10 and the projection segment of the optical axis 41 and the projection segment of the optical axis 42 are symmetric with respect to the Y-axis. However, as shown in FIG. 23(a), the projection segment of the optical axis 41 and the projection segment of the optical axis 42 may intersect each other on the projection plane, the projection segment of the optical axis 41 may be perpendicular to the Y-axis, and the optical axis 42 may not be parallel to the Y-axis.

Figure 23:
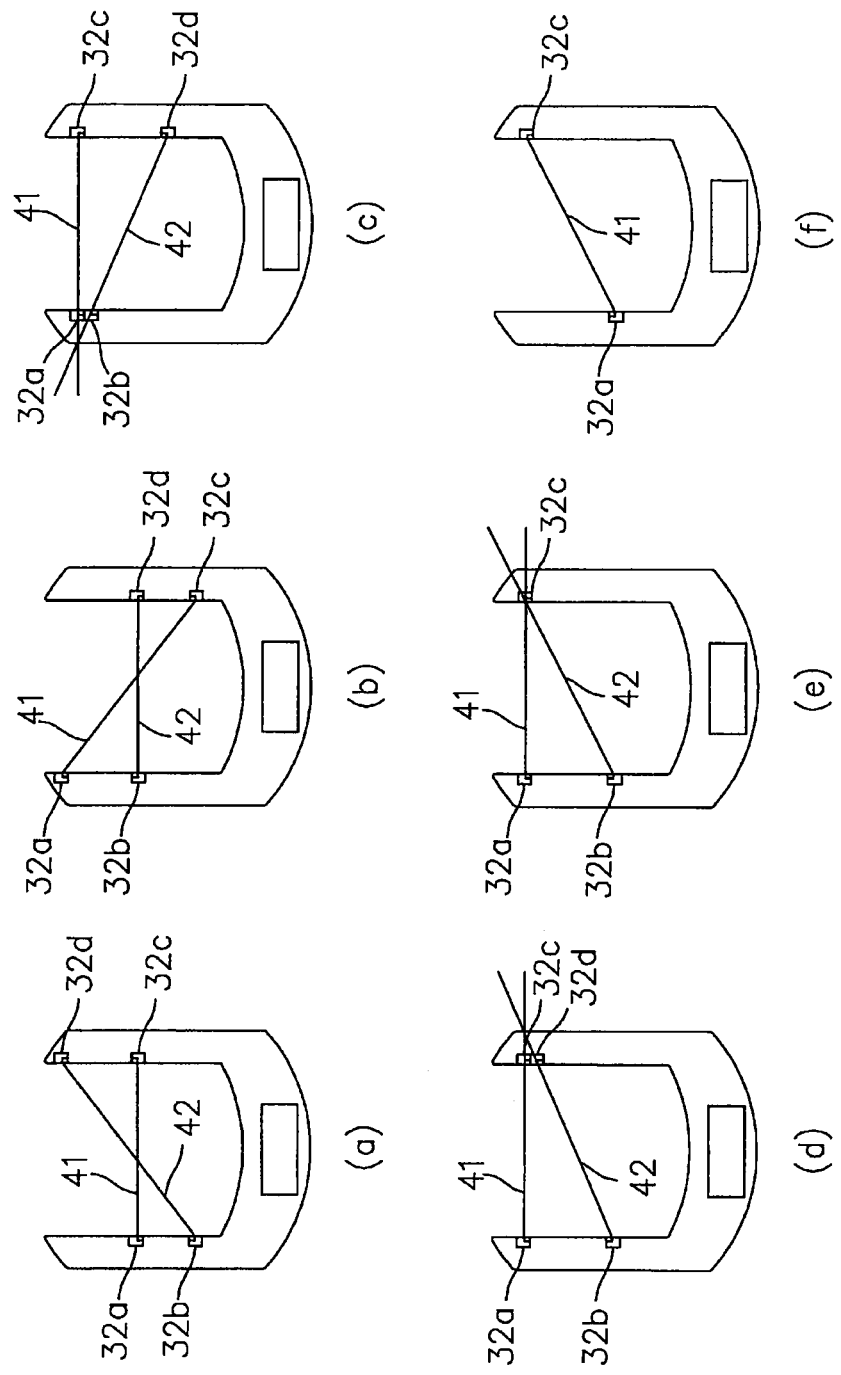
FIG. 23 is a diagram illustrating an example of another sensor jig.

As shown in FIG. 23(b), the projection segment of the optical axis 41 and the projection segment of the optical axis 42 may intersect each other on the projection plane, the projection segment of the optical axis 42 may be perpendicular to the Y-axis, and the projection segment of the optical axis 41 may not be parallel to the Y-axis. In addition, as shown in FIGS. 23(c) and 23(d), an extension line of the projection segment of the optical axis 41 and an extension line of the projection segment of the optical axis 42 may intersect each other on the projection plane, the projection segment of the optical axis 41 may be perpendicular to the Y-axis, and the projection segment of the optical axis 42 may not be parallel to the Y-axis. As shown in FIG. 23(e), the light emitting portions 32a and 32b and the light receiving portion 32c of the transmissive sensor 32 may be provided such that the optical axis 41 from the light emitting portion 32a to the light receiving portion 32c and the optical axis 42 from the light emitting portion 32b to the light receiving portion 32c are on the projection plane. In the above-described embodiment, the transmissive sensor 32 of the sensor jig 30 has two optical axes. However, as shown in FIG. 23(f), the transmissive sensor 32 may include the light emitting portion 32a and the light receiving portion 32c and only the optical axis 41 from the light emitting portion 32a to the light receiving portion 32c may be formed.

In the position teaching method, the light shielding jig 50 is provided at the transport position. Instead of the light shielding jig 50, a member may be used which is provided in the vicinity of the transport position and whose shape size and position relative to the reference position of the transport position have been known.

Figure 8:
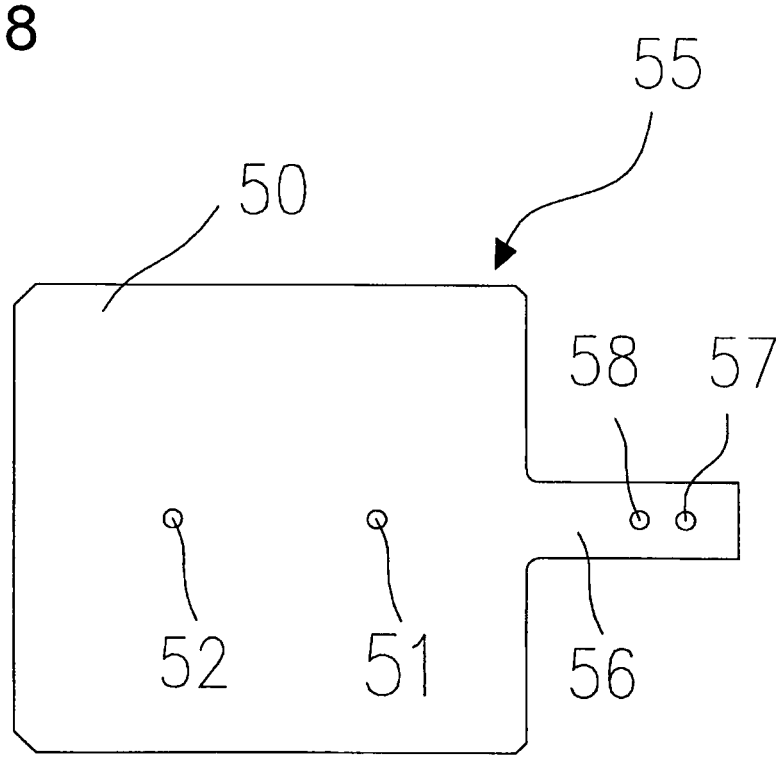
FIG. 8 is a diagram illustrating an example of another light shielding jig.

During a teaching operation, when a movement region in the vicinity of the transport position is narrow and the wafer transport apparatus 10 and the sensor jig 30 are likely to contact an apparatus or a member in the vicinity of the transport position, a light shielding jig 55 shown in FIG. 8 may be used instead of the light shielding jig 50.

The light shielding jig 55 includes a convex portion 56 that protrudes in a direction (−Y direction) facing the sensor jig 30 integrated with the light shielding jig 50 and cylindrical temporary light shielding pins (temporary target members) 57 and 58. The shape sizes and the positions of the temporary light shielding pins 57 and 58 relative to the reference position of the light shielding jig 50 have been known. In addition, the temporary light shielding pins 57 and 58 are provided on the convex portion 56 in the Y direction at positions where the wafer transport apparatus 10 and the sensor jig 30 do not contact an apparatus or a member in the vicinity of the transport position.

When the light shielding jig 55 is used in the wafer transport apparatus 10 and the position teaching method, during the Z-axis correction process, the θ-axis correction process, and the primary X-axis correction process, the temporary light shielding pins 57 and 58 are used instead of the light shielding pins 51 and 52 to calculate teaching information. In addition, during the S-axis correction process, the secondary X-axis correction process, and the Y-axis correction process, the light shielding pins 51 and 52 are used in the same way as that when the light shielding jig 50 is used to calculate the teaching information.

According to the above-mentioned structure in which the sensor jig 30 is provided in the wafer transport apparatus 10, the light shielding jig 55 is provided at the transport position, and then a general transport operation is performed, it is possible to acquire teaching information on the transport position while preventing the contact between an apparatus or a member in the vicinity of the transport position and the wafer transport apparatus 10 or the sensor jig 30 even though a spatial area in the vicinity of the transport position is narrow and the wafer transport apparatus 10 or the sensor jig 30 is likely to contact an apparatus or a member in the vicinity of the transport position when the wafer transport apparatus 10 is operated in order to acquire the teaching information on the transport position.

The invention claimed is:

1. A transport apparatus that comprises holding and transporting an object on a predetermined transport track using a transport portion provided at a leading end of an arm and has a vertical motion in a vertical direction, and a rectilinear motion and a rotary motion in a plane perpendicular to the vertical direction, the vertical direction being a Z direction, a rectilinear direction in terms of the design on the plane being a Y direction, and a direction perpendicular to the Y direction and the Z direction being an X direction, comprising: a transmissive sensor including light emitting portions and light receiving portions that are arranged to form at least one optical axis directing from the light emitting portions to the light receiving portions, wherein the optical axes are not parallel to each other on a projection plane including desired two directions among the X direction, the Y direction, and the Z direction when there is a plurality of optical axes, and at least one of the plurality of optical axes is not parallel to the desired two directions;

one or more target members that can shield the optical axes;

a teaching information calculating unit that acquires, from the transmissive sensor, position information when the target member is changed from a light transmission state in which the target member does not shield the optical axis to a light shielding state in which the target member shields the optical axis or from the light shielding state to the light transmission state and calculates teaching information on a predetermined target position on the transport track on the basis of the acquired position information; and a control unit that controls the transport position of the object on the basis of the teaching information on the target position calculated by the teaching information calculating unit, wherein the transmissive sensor is provided in either one of a leading end portion of the transport portion and a neighboring portion of the target position, the target members are provided in the other one of the leading end portion of the transport portion and the neighboring portion of the target position where the transmissive sensor is not provided, and the optical axes are sequentially moved relative to the target members in one of the desired two directions to acquire the position information.

2. The transport apparatus according to claim 1, wherein the number of target members is two or more, an angle between the direction of an S-axis passing through centers of at least two target members and the Y direction or the X direction is known, and relative positions of the target members are known.

3. The transport apparatus according to claim 2, wherein the direction of the S-axis passing through the centers of the at least two target members is the Y direction or the X direction.

4. The transport apparatus according to any one of claims 1 to 3, wherein, when a direction of the rectilinear motion of the transport portion is an R direction, the teaching information calculating unit includes:

a Z-axis correction information calculating unit that calculates the teaching information configured to correct the target position in the Z direction on the basis of the position information obtained when the optical axes are moved in the Z direction relative to one of the target members and one of the optical axes is shielded by the target member;

a θ-axis correction information calculating unit that calculates the teaching information configured to correct an angular deviation between the R direction and the Y direction on the basis of the position information when the optical axes are relatively moved in parallel until one of the optical axes is shielded by one of the target members and the position information when the optical axis is moved in parallel relative to the target member in the X direction until the optical axis is in the light transmission state again;

an X-axis correction information calculating unit that calculates the teaching information configured to correct the target position in the X direction on the basis of each position information when the number of optical axes is two, two optical axes are moved in parallel relative to one of the target members in the R direction, and the two optical axes are shielded; and a Y-axis correction information calculating unit that calculates the teaching information configured to correct the target position in the R direction on the basis of each position information when there are two optical axes intersecting each other, the two optical axes are moved in parallel relative to one of the target members in the R direction, and the two optical axes are shielded, and the position information when there are two optical axes that do not intersect each other and at least one of the optical axes is shielded.

5. The transport apparatus according to claim 4,
wherein, when the number of target members is two or more, two target members passing through the S-axis are a first target member and a second target member, and there are two optical axes that are not parallel to each other on the projection plane,
the teaching information calculating unit includes an S-axis correction information calculating unit,
when the S-axis is aligned with the Y direction, the S-axis correction information calculating unit calculates the teaching information configured to correct an angular deviation between the S-axis and the Y direction on the basis of each position information when one of the optical axes is moved in parallel relative to the second target member from the center of the first target member in the R direction until the optical axis is shielded by the second target member, the other optical axis is moved in parallel relative to the second target member in the R direction until the optical axis is shielded by the second target member, and the two optical axes are shielded,
when the S-axis is aligned with the X direction, the S-axis correction information calculating unit calculates the teaching information configured to correct an angular deviation between the S-axis and the X direction on the basis of each position information when one of the optical axes is moved in parallel relative to the second target member from the center of the first target member in the X direction until the optical axis is shielded by the second target member, the other optical axis is moved in parallel relative to the second target member in the X direction until the optical axis is shielded by the second target member, and the two optical axes are shielded, and
when the S-axis is not aligned with either the X direction or the Y direction, the S-axis correction information calculating unit calculates the teaching information configured to correct an angular deviation between the Y direction calculated from the S-axis in terms of installation and the Y direction in terms of the design on the basis of each position information when one of the optical axes is moved in parallel relative to the second target member from the center of the first target member in the R direction until the optical axis is shielded by the second target member, the other optical axis is moved in parallel relative to the second target member in the R direction until the optical axis is shielded by the second target member, and the two optical axes are shielded.

6. A transport apparatus that comprises holding and transporting an object on a predetermined transport track using a transport portion provided at a leading end of an arm and has a vertical motion in a vertical direction, and a rectilinear motion and a rotary motion in a plane perpendicular to a vertical direction, the vertical direction being a Z direction, a rectilinear direction in terms of the design on the plane being a Y direction, and a direction perpendicular to the Y direction and the Z direction being an X direction, comprising:
a transmissive sensor including light emitting portions and light receiving portions that are arranged to form at least one optical axis directing from the light emitting portions to the light receiving portions, wherein the optical axes are not parallel to each other on a projection plane including desired two directions among the X direction, the Y direction, and the Z direction when there is a plurality of optical axes, and at least one of the plurality of optical axes is not parallel to the desired two directions;
one or more target members that can shield the optical axes;
one or more temporary correction target members whose positions relative to the target members that can shield the optical axes is known;
a teaching information calculating unit that acquires, from the transmissive sensor, position information when the target members and the temporary correction target members are changed from a light transmission state wherein they do not shield the optical axes to a light shielding state wherein they shield the optical axes or from the light shielding state to the light transmission state and calculates teaching information on a predetermined target position on the transport track on the basis of the acquired position information; and
a control unit that controls the transport position of the object on the basis of the teaching information on the target position calculated by the teaching information calculating unit,
wherein the transmissive sensor is provided in either one of a leading end portion of the transport portion and a neighboring portion of the target position,
the target members and the temporary correction target members are provided in the other one of the leading end portion of the transport portion and the neighboring portion of the target position where the transmissive sensor is not provided,
the temporary correction target members are provided between the transmissive sensor and the target members; and
the optical axes are sequentially moved relative to the target members in one of the desired two directions to acquire the position information.

7. The transport apparatus according to claim 6,
wherein the number of target members is two or more,
an angle between the direction of an S-axis passing through centers of at least two target members and the Y direction or the X direction is known, and
relative positions of the target members are known.

8. The transport apparatus according to claim 7,
wherein the direction of the S-axis passing through the centers of the at least two target members is the Y direction or the X direction.

9. The transport apparatus according to any one of claims 6 to 8,
wherein, when a direction of the rectilinear motion of the transport portion is an R direction,
the teaching information calculating unit includes:
a Z-axis correction information calculating unit that calculates the teaching information configured to correct the target position in the Z direction on the basis of the position information when the optical axes are moved in the Z direction relative to the temporary correction target members and one of the optical axes is shielded by the temporary correction target members;
a θ-axis correction information calculating unit that calculates the teaching information configured to correct an angular deviation between the R direction and the Y direction on the basis of the position information when the optical axes are relatively moved in parallel until one of the optical axes is shielded by the temporary correction target members and the position information when the optical axis is moved in parallel relative to the temporary correction target members in the X direction until the optical axis is in the light transmission state again;

a primary X-axis correction information calculating unit that calculates the teaching information configured to correct the target position in the X direction on the basis of each position information when the number of optical axes is two, two optical axes are moved in parallel relative to the temporary correction target members in the R direction, and the two optical axes are shielded; and a Y-axis correction information calculating unit that calculates the teaching information configured to correct the target position in the R direction on the basis of each position information when there are two optical axes intersecting each other, the two optical axes are moved in parallel relative to one of the target members in the R direction and the two optical axes are shielded, and the position information when there are two optical axes that do not intersect each other and at least one of the optical axes is shielded.

10. The transport apparatus according to according to claim 9, wherein, when the number of target members is two or more and two target members passing through the S-axis are a first target member and a second target member, the teaching information calculating unit includes an S-axis correction information calculating unit, a primary X-axis correction information calculating unit, and a secondary X-axis correction information calculating unit, when there are two optical axes that are not parallel to each other on the projection plane and the S-axis is aligned with the Y direction, the S-axis correction information calculating unit calculates the teaching information configured to correct an angular deviation between the S-axis and the Y direction on the basis of each position information when one of the optical axes is moved in parallel relative to the second target member from the center of the first target member in the R direction until the optical axis is shielded by the second target member, the other optical axes is moved in parallel relative to the second target member in the R direction until the optical axis is shielded by the second target member, and the two optical axes are shielded, when there are two optical axes that are not parallel to each other on the projection plane and the S-axis is aligned with the X direction, the S-axis correction information calculating unit calculates the teaching information configured to correct an angular deviation between the S-axis and the X direction on the basis of each position information when one of the optical axes is moved in parallel relative to the second target member from the center of the first target member in the X direction until the optical axis is shielded by the second target member, the other optical axes is moved in parallel relative to the second target member in the X direction until the optical axis is shielded by the second target member, and the two optical axes are shielded, when there are two optical axes, the primary X-axis correction information calculating unit calculates the teaching information configured to correct the target position in the X direction on the basis of each position information when the two optical axes are moved in parallel relative to one of the target members in the R direction and the two optical axes are shielded, and when there are two optical axes that are not parallel to each other on the projection plane and the S-axis is not aligned with either the X direction or the Y direction, the secondary X-axis correction information calculating unit calculates the teaching information configured to correct an angular deviation between the Y direction calculated from the S-axis in terms of installation and the Y direction in terms of the design on the basis of each position information when one of the optical axes is moved in parallel relative to the second target member from the center of the first target member in the R direction until the optical axis is shielded by the second target member, the other optical axes is moved in parallel relative to the second target member in the R direction until the optical axis is shielded by the second target member, and the two optical axes are shielded.

11. A position teaching method comprising teaching a predetermined target position on a transport track to a transport apparatus that holds and transports an object on a predetermined transport track using a transport portion provided at the leading end of an arm and has a vertical motion in a vertical direction, and a rectilinear motion and a rotary motion in a plane perpendicular to the vertical direction, the vertical direction being a Z direction, a rectilinear direction in terms of the design on the plane being a Y direction, and a direction perpendicular to the Y direction and the Z direction being an X direction, comprising:

(a) a step of sequentially moving a transmissive sensor, which is provided in either one of a leading end portion of the transport portion and a neighboring portion of the target position and includes light emitting portions and light receiving portions arranged to form at least one optical axis directing from the light emitting portions to the light receiving portions, the optical axes are not parallel to each other on a projection plane including desired two directions among the X direction, the Y direction, and the Z direction when there is a plurality of optical axes, and at least one of the plurality of optical axes is not parallel to the desired two directions, in one of the desired two directions relative to one or more target members that are provided in the other one of the leading end portion of the transport portion and the neighboring portion of the target position where the transmissive sensor is not provided, thereby acquiring position information when the target member is changed from a light transmission state wherein the target member does not shield the optical axis to a light shielding state in which the target member shields the optical axis or from the light shielding state to the light transmission state, and calculating teaching information on the target position on the basis of the acquired position information.

12. The position teaching method according to claim 11, wherein the number of target members is two or more, an angle between the direction of an S-axis passing through centers of at least two target members and the Y direction or the X direction is known, and relative positions of the target members are known.

13. The position teaching method according to claim 12, wherein the direction of the S-axis passing through the centers of the at least two target members is the Y direction or the X direction.

14. The position teaching method according to any one of claims 11 to 13,
wherein, when a direction of the rectilinear motion of the transport portion is an R direction,
the step (a) includes at least one of the following four steps:
(b) a step of calculating the teaching information configured to correct the target position in the Z direction on the basis of the position information when the optical axes are moved in the Z direction relative to one of the target members and one of the optical axes is shielded by the target member;
(c) a step of calculating the teaching information configured to correct an angular deviation between the R direction and the Y direction on the basis of the position information when the optical axes are relatively moved in parallel until one of the optical axes is shielded by one of the target members and the position information when the optical axis is moved in parallel relative to the target member in the X direction until the optical axis is in the light transmission state;
(d) a step of calculating the teaching information configured to correct the target position in the X direction on the basis of each position information when the number of optical axes is two, two optical axes are moved in parallel relative to one of the target members in the R direction, and the two optical axes are shielded; and
(e) a step of calculating the teaching information configured to correct the target position in the R direction on the basis of each position information when the number of optical axes is two, two optical axes are moved in parallel relative to one of the target members in the R direction, the two optical axes intersect each other, and the two optical axes are shielded, and the position information when the two optical axes do not intersect each other and at least one of the optical axes is shielded.

15. The position teaching method according to any one of claims 11 to 13,
wherein, when the number of target members is two or more, one of the target members passing through the S-axis is a first target member, and the target member other than the first target member is a second target member,
the step (a) includes at least one of the following two steps:
(f) a step of calculating the teaching information for correcting an angular deviation between the S-axis and the Y direction on the basis of each position information when one of two optical axes is moved in parallel relative to the second target member from the center of the first target member in the R direction and the two optical axes are shielded, when there are the two optical axes that are not parallel to each other on the projection plane and the S-axis is the Y direction, calculating the teaching information for correcting an angular deviation between the S-axis and the X direction on the basis of each position information when one of two optical axes is moved in parallel relative to the second target member from the center of the first target member in the X direction and the two optical axes are shielded, when there are the two optical axes that are not parallel to each other on the projection plane and the S-axis is the X direction, and calculating the teaching information for correcting an angular deviation between the Y direction calculated from the S-axis in terms of installation and the Y direction in terms of the design on the basis of each position information when one of two optical axes is moved in parallel relative to the second target member from the center of the first target member in the R direction and the two optical axes are shielded, when there are the two optical axes that are not parallel to each other on the projection plane and the S-axis is different from the X direction and the Y direction; and
(g) a step of calculating the teaching information configured to correct the target position in the X direction on the basis of each position information when there are two optical axes, the two optical axes are moved in parallel relative to one of the target members in the R direction, and the two optical axes are shielded.

16. A position teaching method comprises teaching a predetermined target position on a transport track to a transport apparatus that holds and transports an object on a predetermined transport track using a transport portion provided at the leading end of an arm and has a vertical motion in a vertical direction, and a rectilinear motion and a rotary motion in a plane perpendicular to the vertical direction, the vertical direction being a Z direction, a rectilinear direction in terms of the design on the plane being a Y direction, and a direction perpendicular to the Y direction and the Z direction being an X direction, comprising:
(a1) a step of sequentially moving a transmissive sensor, which is provided in either one of a leading end portion of the transport portion and a neighboring portion of the target position and includes light emitting portions and light receiving portions arranged to form at least one optical axis directing the light emitting portions to the light receiving portions, the optical axes are not parallel to each other on a projection plane including desired two directions among the X direction, the Y direction, and the Z direction when there is a plurality of optical axes, and at least one of the plurality of optical axes is not parallel to the desired two directions, in one of the desired two directions relative to one or more target members that are provided in the other one of the leading end portion of the transport portion and the neighboring portion of the target position where the transmissive sensor is not provided and one or more temporary correction target members which are provided between the target members and the transmissive sensor in the other one of the leading end portion of the transport portion and the neighboring portion of the target position where the transmissive sensor is not provided and whose positions relative to the target members are known, thereby acquiring position information when the target members and the temporary correction target members are changed from a light transmission state wherein they do not shield the optical axes to a light shielding state in which they shield the optical axes or from the light shielding state to the light transmission state, and calculating teaching information on the target position on the basis of the acquired position information.

17. The position teaching method according to claim 16,
wherein the number of target members is two or more,
an angle between the direction of an S-axis passing through centers of at least two target members and the Y direction or the X direction is known, and
relative positions of the target members are known.

18. The position teaching method according to claim 17,
wherein the direction of the S-axis passing through the centers of the at least two target members is the Y direction or the X direction.

19. The position teaching method according to any one of claims 16 to 18,
- wherein, when a direction of the rectilinear motion of the transport portion is an R direction,
- the step (a1) includes at least one of the following four steps:
- (b1) a step of calculating the teaching information configured to correct the target position in the Z direction on the basis of the position information when the optical axes are moved in the Z direction relative to the temporary correction target members and one of the optical axes is shielded by the temporary correction target members;
- (c1) a step of calculating the teaching information configured to correct an angular deviation between the R direction and the Y direction on the basis of the position information when the optical axes are relatively moved in parallel until one of the optical axes is shielded by the temporary correction target members and the position information when the optical axis is moved in parallel relative to the temporary correction target members in the X direction until the optical axis is in the light transmission state;
- (d1) a step of calculating the teaching information configured to correct the target position in the X direction on the basis of each position information when the number of optical axes is two, two optical axes are moved in parallel relative to the temporary correction target members in the R direction, and the two optical axes are shielded; and
- (e1) a step of calculating the teaching information configured to correct the target position in the R direction on the basis of each position information when the number of optical axes is two, two optical axes are moved in parallel relative to one of the target members in the R direction, the two optical axes intersect each other, and the two optical axes are shielded, and the position information when the two optical axes do not intersect each other and at least one of the optical axes is shielded.

20. The position teaching method according to any one of claims 16 to 18,
- wherein, when the number of target members is two or more, one of the target members passing through the S-axis is a first target member, and the target member other than the first target member is a second target member,
- the step (a1) includes at least one of the following two steps:
- (f1) a step of calculating the teaching information configured to correct an angular deviation between the S-axis and the Y direction on the basis of each position information when one of two optical axes is moved in parallel relative to the second target member from the center of the first target member in the R direction and the two optical axes are shielded, when there are the two optical axes that are not parallel to each other on the projection plane and the S-axis is the Y direction, calculating the teaching information configured to correct an angular deviation between the S-axis and the X direction on the basis of each position information when one of two optical axes is moved in parallel relative to the second target member from the center of the first target member in the X direction and the two optical axes are shielded, when there are the two optical axes that are not parallel to each other on the projection plane and the S-axis is the X direction, and calculating the teaching information configured to correct an angular deviation between the Y direction calculated from the S-axis in terms of installation and the Y direction in terms of the design on the basis of each position information when one of two optical axes is moved in parallel relative to the second target member from the center of the first target member in the R direction and the two optical axes are shielded, when there are the two optical axes that are not parallel to each other on the projection plane and the S-axis is different from the X direction and the Y direction; and
- (g) a step of calculating the teaching information configured to correct the target position in the X direction on the basis of each position information when there are two optical axes, the two optical axes are moved in parallel relative to one of the target members in the R direction, and the two optical axes are shielded.

21. A sensor jig that is moved in parallel relative to a target member and detects the target member, comprising:
- a transmissive sensor having at least one optical axis directing light from light emitting portions to light receiving portions of the sensor,
- wherein, when a plurality of the optical axes is formed, the light emitting portions and the light receiving portions are arranged such that the optical axes are not parallel to each other on the same projection plane, and at least one of the plurality of optical axes is not parallel to a relative movement direction to the target member which is projected onto the projection plane and is not parallel to a direction perpendicular to the movement direction.

22. A transport apparatus that comprises holding and transporting an object on a predetermined transport track using a transport portion provided at a leading end of an arm and has a vertical motion in a vertical direction and a rectilinear motion and a rotary motion in a plane perpendicular to the vertical direction, comprising:
- the sensor jig according to claim 21,
- wherein teaching information on a predetermined target position on the transport track is calculated on the basis of position information when the target member is changed from a light transmission state in which the target member does not shield the optical axis to a light shielding state in which the target member shields the optical axis or from the light shielding state to the light transmission state which is acquired by the transmissive sensor of the sensor jig.

* * * * *